(12) United States Patent
Kim et al.

(10) Patent No.: US 11,804,437 B2
(45) Date of Patent: Oct. 31, 2023

(54) SEMICONDUCTOR DEVICE, METHOD FOR FABRICATING THE SEMICONDUCTOR DEVICE, AND MEMORY DEVICE AND SYSTEM INCLUDING THE SEMICONDUCTOR DEVICE

(71) Applicant: SK hynix Inc., Icheon-si (KR)

(72) Inventors: Nam-Kuk Kim, Yongin-si (KR); Nam-Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 21 days.

(21) Appl. No.: 17/563,685

(22) Filed: Dec. 28, 2021

(65) Prior Publication Data

US 2022/0122916 A1    Apr. 21, 2022

Related U.S. Application Data

(63) Continuation of application No. 16/703,022, filed on Dec. 4, 2019, now Pat. No. 11,244,902.

(30) Foreign Application Priority Data

May 3, 2019    (KR) .................. 10-2019-0052203

(51) Int. Cl.
  *H01L 27/11582*    (2017.01)
  *H01L 23/535*    (2006.01)
  *G11C 16/04*    (2006.01)
  *H10B 43/27*    (2023.01)
  *H10B 43/40*    (2023.01)

(52) U.S. Cl.
  CPC ........ *H01L 23/535* (2013.01); *G11C 16/0483* (2013.01); *H10B 43/27* (2023.02); *H10B 43/40* (2023.02)

(58) Field of Classification Search
  CPC .............................. H10B 43/27; H10B 43/20
  See application file for complete search history.

(56) References Cited

U.S. PATENT DOCUMENTS

| 2019/0156897 A1 | 5/2019 | Lee et al. |
| 2019/0326316 A1 | 10/2019 | Son et al. |
| 2020/0027893 A1 | 1/2020 | Yang et al. |

FOREIGN PATENT DOCUMENTS

| KR | 1020180095499 A | 8/2018 |
| KR | 1020190122372 A | 10/2019 |

*Primary Examiner* — Christopher A Johnson
(74) *Attorney, Agent, or Firm* — WILLIAM PARK & ASSOCIATES LTD.

(57) ABSTRACT

A semiconductor device according to an embodiment of the present disclosure may include: a stack structure including a plurality of first conductive patterns and a plurality of dielectric layers, which are alternately stacked, the stack structure having a stepped structure such that any one of the first conductive patterns further protrudes than the first conductive pattern positioned immediately above it; a plurality of second conductive patterns which are respectively formed over protrusions of the first conductive patterns; a plurality of contact plugs which overlap the plurality of second conductive patterns, respectively, and pass through the overlapping second conductive patterns and the stack structure; and a sealing layer pattern which is interposed between the first conductive patterns and the contact plugs and separates the first conductive patterns from the contact plugs.

12 Claims, 29 Drawing Sheets

SEMICONDUCTOR DEVICE, METHOD FOR FABRICATING THE SEMICONDUCTOR DEVICE, AND MEMORY DEVICE AND SYSTEM INCLUDING THE SEMICONDUCTOR DEVICE

CROSS-REFERENCE TO RELATED APPLICATIONS

The present application is a continuation application of U.S. patent application Ser. No. 16/703,022, filed on Dec. 4, 2019, and claims priority of Korean Patent Application No. 10-2019-0052203, filed on May 3, 2019, which is incorporated herein by reference in its entirety.

BACKGROUND

1. Technical Field

This patent document relates to a memory device, and more particularly, to a memory device and a method for fabricating the memory device.

2. Related Art

Nonvolatile memory devices that can store data and retain the stored data even when the power supply is interrupted, NAND type flash memory devices, for example, have been developed.

In recent years, as an increase in the integration degree of two-dimensional memory devices having memory cells formed as a single layer on a semiconductor substrate has reached the limit, various three-dimensional memory devices having memory cells stacked in multiple layers on a semiconductor substrate have been proposed.

SUMMARY

In one embodiment, a semiconductor device may include: a stack structure including a plurality of first conductive patterns and a plurality of dielectric layers, which are alternately stacked, the stack structure having a stepped structure such that any one of the first conductive patterns further protrudes than the first conductive pattern positioned immediately above it; a plurality of second conductive patterns which are respectively formed over protrusions of the first conductive patterns; a plurality of contact plugs which overlap the plurality of second conductive patterns, respectively, and pass through the overlapping second conductive patterns and the stack structure; and a sealing layer pattern which is interposed between the first conductive patterns and the contact plugs and separates the first conductive patterns from the contact plugs.

In another embodiment, a method for fabricating a semiconductor device may include: forming a stack structure including a plurality of sacrificial layers and a plurality of dielectric layers, which are alternately stacked, the stack structure having a stepped structure such that any one of the sacrificial layers further protrudes than the sacrificial layer positioned immediately above it; forming a plurality of sacrificial pads over protrusions of the plurality of sacrificial layers, respectively; forming a plurality of contact holes which overlap the plurality of sacrificial pads, respectively, and pass through the overlapping sacrificial pads and the stack structure; forming grooves by recessing a portion of the sacrificial layers exposed through the contact holes; forming a sealing layer which fills the grooves; forming contact plugs which fill the contact holes; forming a slit which passes through the stack structure; removing the sacrificial layers and sacrificial pads exposed through the slit; and filling, with a conductive material, spaces from which the sacrificial layers and the sacrificial pads have been removed.

In another embodiment, a method for fabricating a semiconductor device may include: forming a stack structure including a plurality of sacrificial layers and a plurality of dielectric layers, which are alternately stacked, the stack structure having a stepped structure such that any one of the sacrificial layers further protrudes than the sacrificial layer positioned immediately above it; forming a plurality of sacrificial pads over protrusions of the plurality of sacrificial layers, respectively; forming a plurality of contact holes which overlap the plurality of sacrificial pads, respectively, and pass through the overlapping sacrificial pads and the stack structure; forming a sealing layer on the side wall of the contact holes; forming contact plugs which fill the contact holes having the sealing layer formed thereon; forming a slit which passes through the stack structure; removing the sacrificial pads exposed through the slit, and removing the sealing layer exposed by removal of the sacrificial pads; removing the sacrificial layers exposed through the slit; and filling, with a conductive material, spaces from which the sacrificial layers and the sacrificial pads have been removed.

In yet another embodiment, a memory device may include: a stack structure formed in a cell array region and a contact region and including a plurality of first conductive patterns and a plurality of dielectric layers, which are alternately stacked, in which the stack structure has a stepped structure such that any one of the first conductive patterns in the contact region further protrudes than the first conductive pattern positioned immediately above it; a channel pillar which passes through the stack structure of the cell array region; a memory layer interposed between the channel pillar and the first conductive patterns; a plurality of second conductive patterns which are respectively formed over protrusions of the plurality of first conductive patterns in the contact region; a plurality of contact plugs which overlap the plurality of second conductive patterns, respectively, and pass through the overlapping second conductive patterns and the stack structure; and a sealing layer pattern which is interposed between the first conductive patterns and the contact plugs and separates the first conductive patterns from the contact plugs.

In yet another embodiment, a system may include: a memory device for storing data; a host accessing the data stored in the memory device; and a controller for controlling the memory device in response to a request of the host between the host and the memory device, wherein the memory device includes: a stack structure formed in a cell array region and a contact region and comprising a plurality of first conductive patterns and a plurality of dielectric layers, which are alternately stacked, in which the stack structure has a stepped structure such that any one of the first conductive patterns in the contact region further protrudes than the first conductive pattern positioned immediately above it; a channel pillar which passes through the stack structure of the cell array region; a memory layer which is interposed between the channel pillar and the first conductive patterns; a plurality of second conductive patterns which are respectively formed over protrusions of the plurality of first conductive patterns in the contact region; a plurality of contact plugs which overlap the plurality of second conductive patterns, respectively, and pass through the overlapping second conductive patterns and the stack structure; and a sealing layer pattern which is interposed between the first conductive patterns and the contact plugs and separates the first conductive patterns from the contact plugs.

DETAILED DESCRIPTION

Figure 1A:
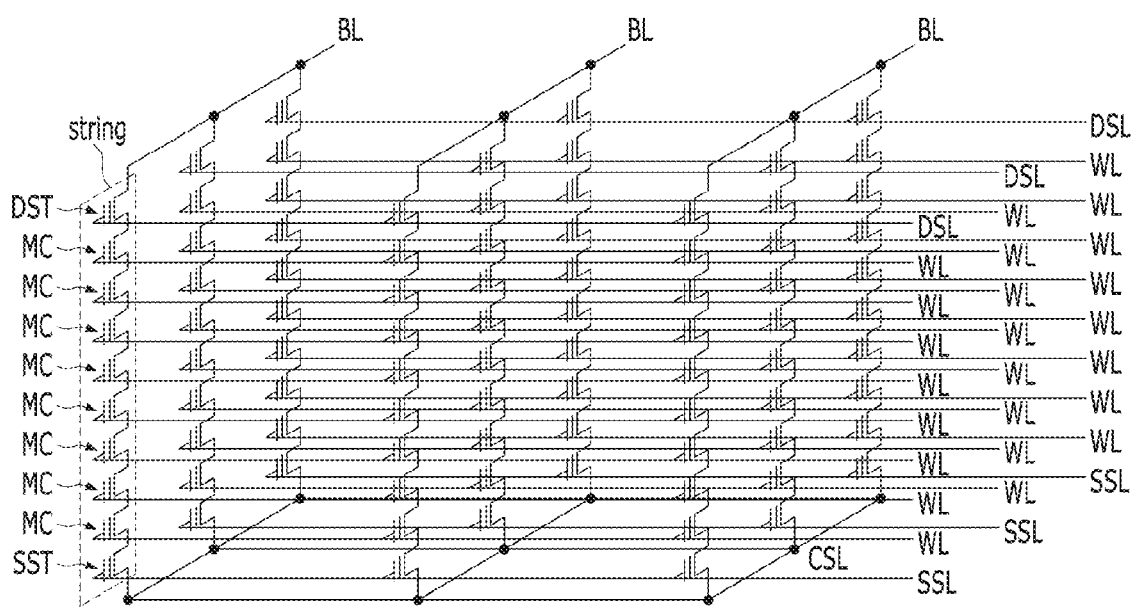
FIG. 1A is a circuit diagram illustrating a cell array of a memory device according to an embodiment of the present disclosure.

Various embodiments will be described below in with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure. The drawings are not necessarily to scale and in some instances, proportions may have been exaggerated in order to clearly illustrate features of the embodiments.

Various embodiments are directed to a semiconductor device which may enable process improvement and may have a reduced area, a method for manufacturing the semiconductor device, and a memory device and system including the semiconductor device.

Figure 1B:
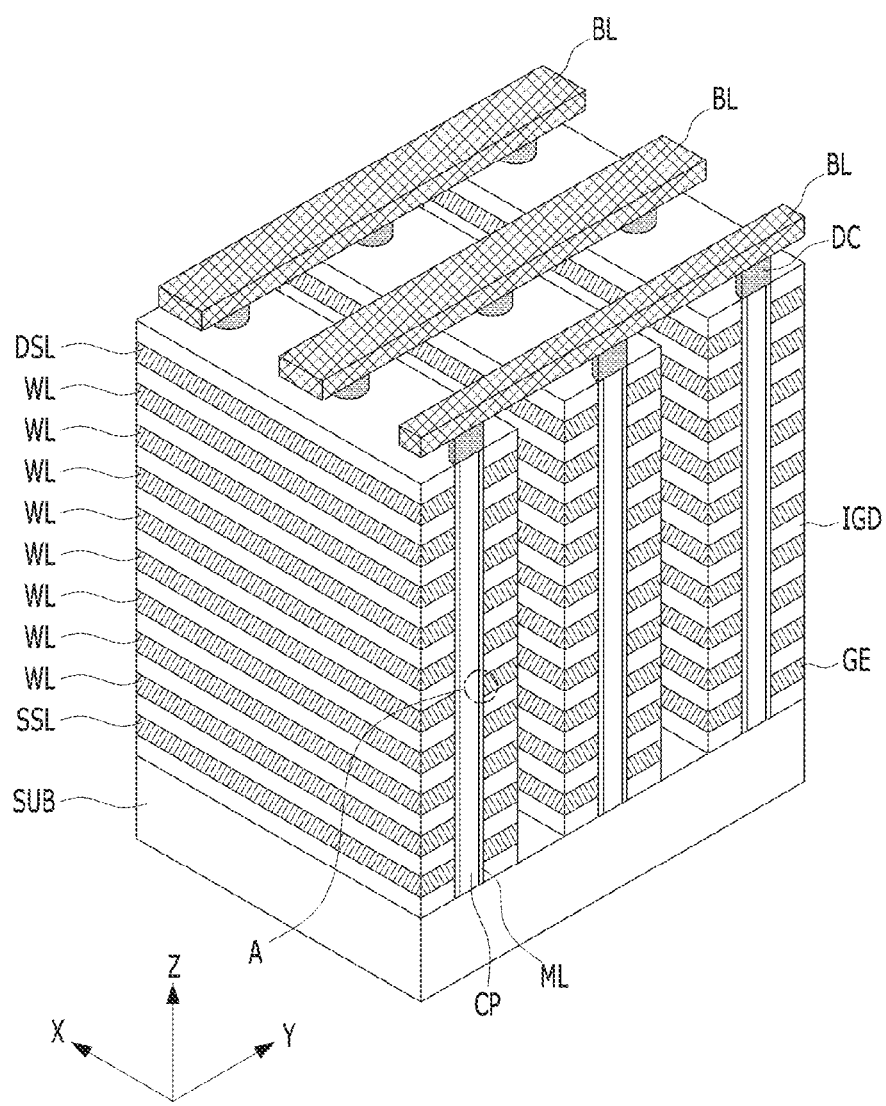
FIG. 1B is a perspective view corresponding to the cell array shown in FIG. 1A.
Figure 1C:
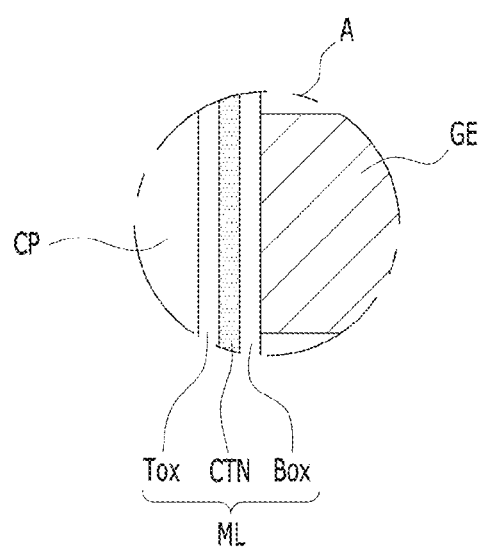
FIG. 1C is an enlarged view of portion A shown in FIG. 1B.

FIG. 1A is a circuit diagram illustrating a cell array of a memory device according to an embodiment of the present disclosure; FIG. 1B is a perspective view corresponding to the cell array shown in FIG. 1A; and FIG. 1C is an enlarged view of portion A shown in FIG. 1B.

Referring to FIG. 1A, the cell array of the memory device according to an embodiment may include a plurality of strings, a plurality of bit lines BL, a plurality of word lines WL, a plurality of drain selection lines DSL, a plurality of source selection lines SSL, and a common source line CSL. Here, the number of the strings, the number of the bit lines BL, the number of the word lines WL, the number of the drain selection lines DSL and the number of the source selection lines SSL are not limited to those shown in the figure and may be variously changed as needed.

The strings may be connected between the bit lines BL and the common source line CSL. FIG. 1A shows a case in which three strings are connected to each of the bit lines BL, but the number of strings that are connected to each of the bit lines BL may be variously changed. Each of the strings may include a source selection transistor SST, a plurality of memory cells MC, and a drain selection transistor DST, which are connected in series. FIG. 1A shows a case in which eight memory cells MC are connected in series between one source selection transistor SST and one drain selection transistor DST, but the number of the source selection transistors SST, the number of the drain selection transistors DST, and the number of the memory cells MC that are connected therebetween may be variously changed. In an embodiment, the memory cells MC and the strings may be NAND flash memory cells and NAND strings, respectively.

Both junctions of the source selection transistor SST may be connected to the common source line CSL and one junction of the adjacent memory cell MC, respectively, and a gate may be connected to the corresponding source selection line SSL. Both junctions of the memory cell MC may be connected to the adjacent memory cell MC and one junction of the adjacent source selection transistor SST or the adjacent drain selection transistor DST, respectively, and the gate may be connected to the corresponding word line WL. Both junctions of the drain selection transistor DST may be connected to the corresponding bit line BL and one junction of the adjacent memory cell MC, respectively, and the gate may be connected to the corresponding drain selection line DSL.

In the memory device described above, operations such as write and read with respect to the selected memory cell MC may be performed by controlling a bias that is applied to a word line WL connected to the selected memory cell MC, a source selection line SSL and a drain selection line DSL, which are respectively connected to the source selection transistor SST and drain selection transistor DST of the string including the selected memory cell MC, and a bit line BL connected to the string including the selected memory cell MC. Each of the memory cells MC may store one or more bits. For example, each of the memory cells MC may be used as a single-level cell (SLC), a multi-level cell (MLC) or a triple-level cell.

Referring to FIG. 1B, the cell array shown in FIG. 1A may have a three-dimensional structure in which memory cells MC are arranged and/or stacked in a direction perpendicular to a substrate SUB.

The substrate SUB may include a semiconductor substrate, and may further include various elements (not shown) formed in and/or on the semiconductor substrate. In one example, the substrate SUB may include a semiconductor substrate such as silicon, which contains an impurity of a predetermined conductivity type, for example, p type, and an impurity region which is formed in the semiconductor substrate and is of a conductivity type (e.g., n type) different from that of the semiconductor substrate. This impurity region may function as a common source line CSL. In another example, the substrate SUB may include a semiconductor substrate and a patterned semiconductor layer formed on the semiconductor substrate. In the patterned semiconductor layer, an impurity region functioning as a common source line CSL may also be formed.

On the substrate (SUB), there may be provided a plurality of stack structures which each extends along the X-direction and in which a plurality of gate electrode layers GE and a plurality of inter-gate dielectric layers IGD are alternately stacked along the Z-direction. The plurality of stack structures may be arranged to be spaced apart from one another along the Y-direction. The plurality of gate electrode layers GE may function as a source selection line SSL, word lines WL or a drain selection line DSL. For example, in an embodiment, the lowest gate electrode layer GE may function as a source selection line SSL, the uppermost gate electrode layer GE may function as a drain selection line DSL, and the remaining gate electrode layers GE may function as word lines WL.

In addition, on the substrate SUB, there may be provided channel pillars CP, which are connected to the substrate and pass through the stack structures in which the gate electrode layers GE and the inter-gate dielectric layers IGD are alternately stacked. Each of the channel pillars CP may be connected to a necessary portion of the substrate SUB, for example, a portion of the above-described semiconductor substrate or semiconductor layer. Each of the channel pillars CP may have a columnar shape extending along the Z-direction and include a semiconductor material such as silicon.

Between each channel pillar CP and each stack structure in which the gate electrode layers GE and the inter-gate dielectric layers IGD are alternately stacked, a memory layer ML may be provided. The memory layer ML may include a triple layer c composed of a tunnel dielectric layer Tox, a charge storage layer CTN and a charge blocking layer Box, which are sequentially arranged from the channel pillar CP (see FIG. 1C). In an embodiment, the memory layer ML has a cylindrical shape extending in the Z-direction while surrounding the side surface of the channel pillar CP, but is not limited to that shown in the figure, and the shape of the memory layer ML may be variously modified as long as the memory layer ML is located between the gate electrode layers GE functioning as word lines WL and the channel pillar CP.

Between the gate electrode layer GE functioning as a drain selection line DSL and the channel pillar CP and/or between the gate electrode layer GE functioning as a source selection line SSL and the channel pillar CP, a gate dielectric layer (not shown) different from the memory layer ML may also be formed instead of the memory layer ML.

One word line WL surrounding one channel pillar CP and a memory layer ML disposed therebetween may form one memory cell MC; one source selection line SSL surrounding one channel pillar CP and a memory layer ML (or a gate dielectric layer (not shown)) disposed therebetween may form one source selection transistor SST; and one drain selection line DSL surrounding one channel pillar CP and a memory layer ML (or a gate dielectric layer (not shown)) disposed therebetween may form one drain selection transistor DST. In addition, a source selection transistor SST, memory cells MC and a drain selection transistor DST, which are stacked along one channel pillar CP, may form one string.

At the top of each of the channel pillars CP, a drain contact DC may be provided. The drain contact DC may include a semiconductor material, such as silicon doped with an impurity of a predetermined conductivity type, for example, n type.

On the drain contact DC, bit lines BL arranged to be spaced apart from one another along the X-direction while extending in the Y-direction may be provided.

As a result, the cell array of FIG. 1A may be realized in three dimensions on the substrate SUB, as shown in FIG. 1B.

The stack structure in which the gate electrode layers GE and the inter-gate dielectric layers IGD are alternately stacked as shown in FIG. 1B may further extend in the X-direction and may end in a region in which the memory cells MC are not disposed. The end of this stack structure in which the gate electrode layers GE and the inter-gate dielectric layers IGD are alternately stacked may be patterned to have generally a stepped shape, in order to form a contact plug which is connected to each gate electrode layer GE. This will be described with reference to FIGS. 2A and 2B.

Figure 2A:
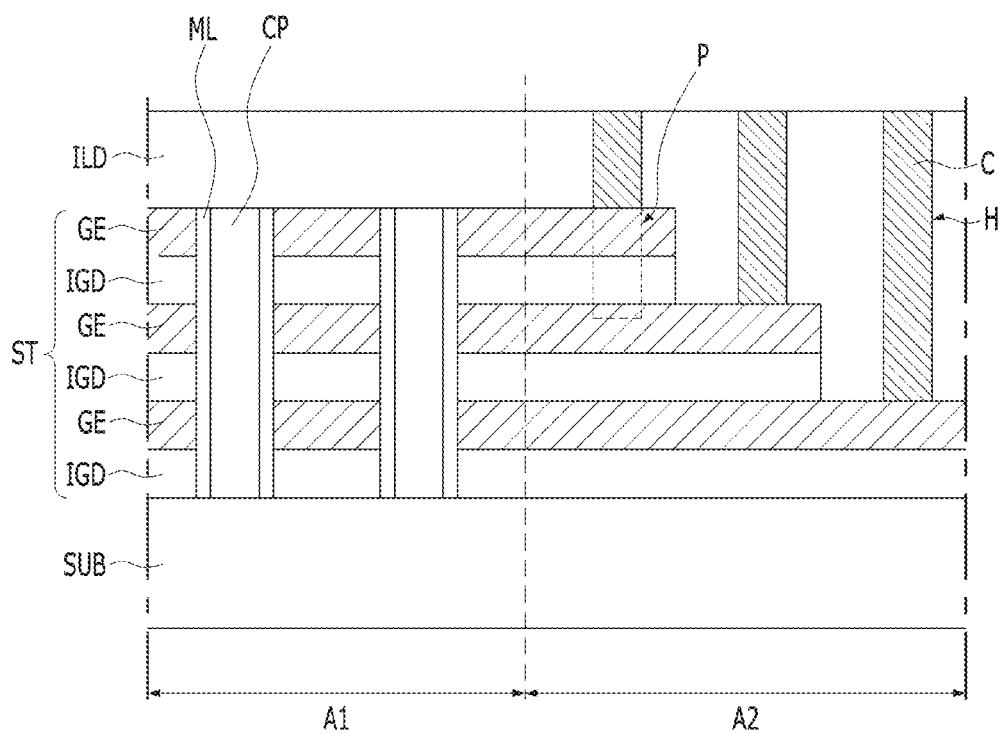
FIGS. 2A and 2B are a sectional view and a top view, respectively, which illustrate a memory device according to an embodiment of the present disclosure.
Figure 2B:
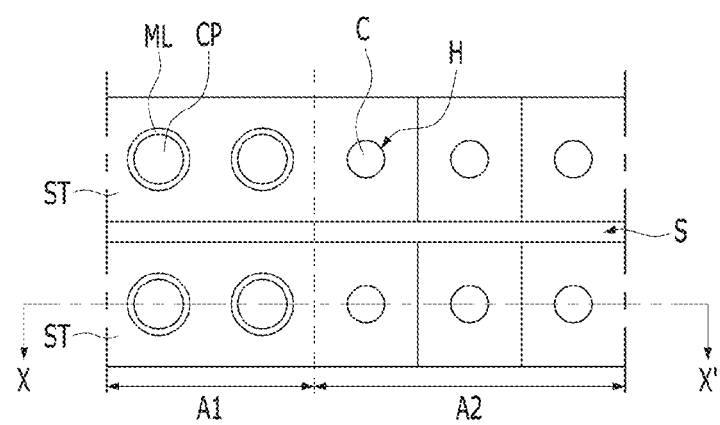

FIGS. 2A and 2B are a sectional view and a top view, respectively, which illustrate a memory device according to an embodiment of the present disclosure. For example, FIG. 2A is a sectional view taken along line X-X' of FIG. 2B.

Referring to FIGS. 2A and 2B, the memory device of an embodiment may include a cell array region A1 and a contact region A2.

The cell array region A1 is a region in which a plurality of memory cells are disposed, and may have a structure similar that of the cell array shown in FIG. 1B. The cell array region A1 corresponds to a section obtained by cutting the cell array of FIG. 1B in the X-direction. However, for convenience of explanation, it is shown as including only a portion of the cell array shown in FIG. 1B, that is, three gate electrode layers GE and two channel pillars CP arranged in each of the X-direction and the Y-direction. As described above, the cell array region A1 may include: a stack structure ST in which a plurality of gate electrode layers GE and a plurality of inter-gate dielectric layers IGD are alternately stacked on a substrate SUB; a channel pillar CP formed to pass through the stack structure ST; and a memory layer ML interposed between the stack structure ST and the channel pillar CP. The stack structures ST may be arranged in the Y-direction and may be separated from each other by a slit S. In an embodiment, the memory layer ML has a shape surrounding the sidewall of the channel pillar CP, but is not limited thereto, and the memory layer ML may have various shapes as long as it is interposed between the channel pillar CP and the gate electrode layer GE. For example, the shape of the memory layer ML may be changed such that the memory layer ML may be formed along the top surface of each gate electrode layer GE, the side facing the channel pillar CP, and the bottom surface thereof. In addition, the channel pillar CP may also have various shapes, such as a hollow cylindrical shape, as long as it extends in the Z-direction.

The stack structure ST may extend in the X-direction and may also be located on the substrate SUB in the contact region A2 adjacent to the cell array region A1. Since the stack structure ST may end in the contact region A2, the stack structure ST of the contact region A2 will hereinafter be referred to as the "end of the stack structure ST". The end of the stack structure ST may be patterned by an etching process called slimming to generally have a stepped shape. Accordingly, any gate electrode layer GE positioned at a predetermined height from the substrate SUB may have a portion that further protrudes toward the contact region A2 in the X-direction than the gate electrode layer GE positioned immediately above it. Hereinafter, among the gate electrode layers GE, the portion of any gate electrode layer GE that further protrudes toward the contact region A2 than the gate electrode layer GE positioned immediately above it will be referred to as a protrusion of the gate electrode layer GE. The slit S in the cell array region A1 may extend to the contact region A2 and separate the ends of the stack structures ST from one another, which are arranged in the X-direction in the contact region A2.

On the substrate SUB and stack structure ST of each of the cell array region A1 and the contact region A2, an interlayer dielectric layer ILD covering them may be formed.

Although not shown in the figure, in the cell array region A1, there may be further formed drain contact plugs, which pass through the interlayer dielectric layer ILD and are respectively connected to the channel pillars CP, bit lines which extend in one direction on the interlayer dielectric layer ILD while connecting these drain contact plugs to one another, and the like.

In the contact region A2, contact plugs C may be formed, which pass through the interlayer dielectric layer ILD and are respectively connected to the gate electrode layers GE. In order to appropriately drive the word lines WL, the source selection line SSL and the drain selection line DSL, each of the gate electrode layers GE, which function as word lines WL, a source selection line SSL and a drain selection line DSL, needs to be connected to a portion of a peripheral circuit (not shown), for example, a switching transistor. To this end, it may be necessary to form contact plugs C which are respectively connected to the gate electrode layers GE in one stack structure ST. The contact plugs C may overlap and be connected to a protrusion of each of the uppermost gate electrode layer GE and the remaining gate electrode layers GE.

A process of forming the contact plugs C may be performed by selectively etching the interlayer dielectric layer ILD to form contact holes H, each exposing a protrusion of each gate electrode layer GE, and then filling the contact holes H with a conductive material. Etching the interlayer dielectric layer ILD to form the contact holes H may be performed such that the etching is stopped on each gate electrode layer GE, while it is performed until the lowest gate electrode layer GE is exposed. However, the gate electrode layer GE positioned at a relatively high level is exposed earlier by the contact hole H than the gate electrode layer GE positioned at a relatively low level. For this reason, in the process of etching the interlayer dielectric layer ILD until the lowest gate electrode layer GE is exposed, punching failure may occur in which the etching stop function is not achieved and punching occurs. As one example, as indicated by reference numeral P, there may occur a case in which a contact hole H exposing the uppermost gate electrode layer GE passes through the uppermost gate electrode layer GE and exposes the gate electrode layer GE located under it. In this case, a problem may arise in that a contact plug C to be connected to the uppermost gate electrode layer GE undesirably also contacts the gate electrode layer GE located under the uppermost gate electrode layer GE. Such punching failure can be exacerbated as the integration degree of the memory device increases, that is, as the number of gate electrode layers GE stacked increases.

In the following embodiments, description will be made on a memory device and a method for fabricating the same, which may prevent the above-described problem and furthermore, have various improved effects.

FIGS. 3A and 3B through FIGS. 11A and 11B are views illustrating a memory device and a method for fabricating the same according to an embodiment of the present disclosure. For example, in these figures, each figure with A next to the number is a sectional view, and each figure with B next to the number is a top view taken along line H1-H1' of A. For convenience of description, these figures are shown centered on the contact region A2.

First, the fabrication method will be described.

Figure 3A:
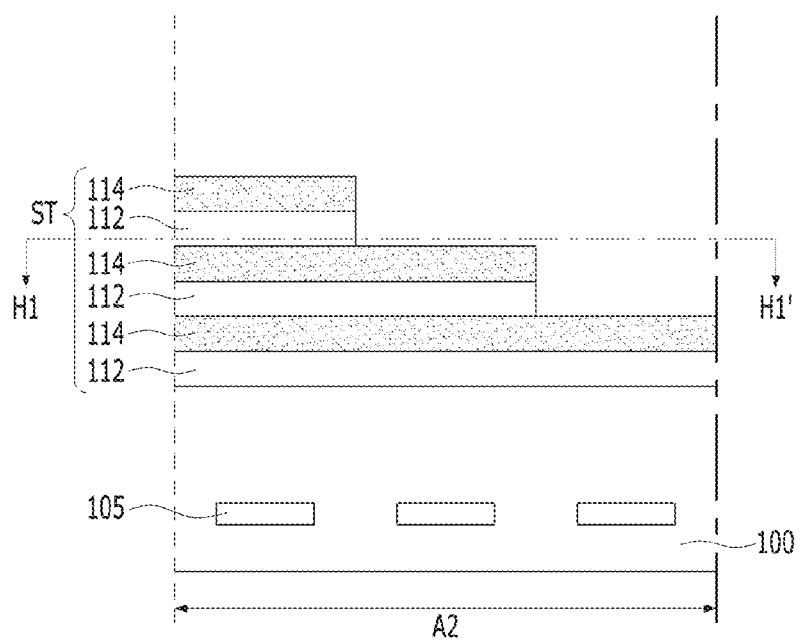
FIGS. 3A, 3B, 4A, 4B, 5A, 5B, 6A, 6B, 7A, 7B, 8A, 8B, 9A, 9B, 10A, 10B, 11A, and 11B are views illustrating a memory device and a method for fabricating the same according to another embodiment of the present disclosure.
Figure 3B:

Referring to FIGS. 3A and 3B, a substrate 100 may be provided. The substrate 100 may include a semiconductor substrate and may further include various elements formed in and/or on the semiconductor substrate. In particular, in an embodiment, the substrate 100 may include peripheral circuit elements 105 formed in a contact region A2. The peripheral circuit elements 105 are elements that may be respectively connected to the gate electrode layers of the memory cell. They are shown in the form of a box for convenience, but may include one junction of a switching transistor, a metal pad, a metal wiring, and the like.

Then, on the substrate 100 including the peripheral circuit elements 105, there may be formed a stack structure ST in which a plurality of inter-gate dielectric layers 112 and a plurality of sacrificial layers 114 are alternately stacked. The inter-gate dielectric layers 112 function to insulate the vertically adjacent gate electrode layers of the memory cell from each other, and may include various dielectric materials, for example, silicon oxide, silicon nitride, silicon oxynitride, or a combination of two or more thereof. The sacrificial layers 114 are layers to be replaced by a conductive material functioning as the gate electrode layers of the memory cell, may include various materials having an etch rate different from that of the inter-gate dielectric layers 112, and may include, in addition to a dielectric material, a semiconductor material or a conductive material. The reason why the sacrificial layers 114 have an etch rate different from that of the inter-gate dielectric layers 112 is to prevent the inter-gate dielectric layers 112 from being lost during a subsequent process of removing the sacrificial layers 114. In one example, the inter-gate dielectric layers 112 may include silicon oxide, and the sacrificial layers 114 may include silicon nitride. Although an embodiment shows three inter-gate dielectric layers 112 and three sacrificial layers 114, which are alternately stacked in the vertical direction, the number of the inter-gate dielectric layers 112 and the number of the sacrificial layers 114 may be variously changed.

Here, the stack structure ST in the contact region A2 may be patterned to generally have a stepped shape. Accordingly, any sacrificial layer 114 may have a portion that further protrudes toward the contact region A2 than a sacrificial layer 114 positioned immediately above it. Accordingly, the surface of the protrusion of each of the uppermost sacrificial layer 114 and the remaining sacrificial layers 114 may be in an exposed state immediately after patterned to have the stepped shape.

Although not shown in the figure, before patterning the stack structure ST of the contact region A2, the channel pillars CP and memory layer ML described above with reference to FIGS. 2A and 2B may be formed in the stack structure ST including the plurality of inter-gate dielectric layers 112 and the plurality of sacrificial layers 114, formed in the cell array region. However, if necessary, in this step, only the channel pillars CP may be formed, and the memory layer ML may not be formed or only a portion of the memory layer ML may be formed. In this case, the whole or a portion of the memory layer ML, which has not been formed, may be formed later, for example, between a process of removing the sacrificial layers 114 and a process of filling the gate electrode layers. This will be described in the corresponding section.

Figure 4A:
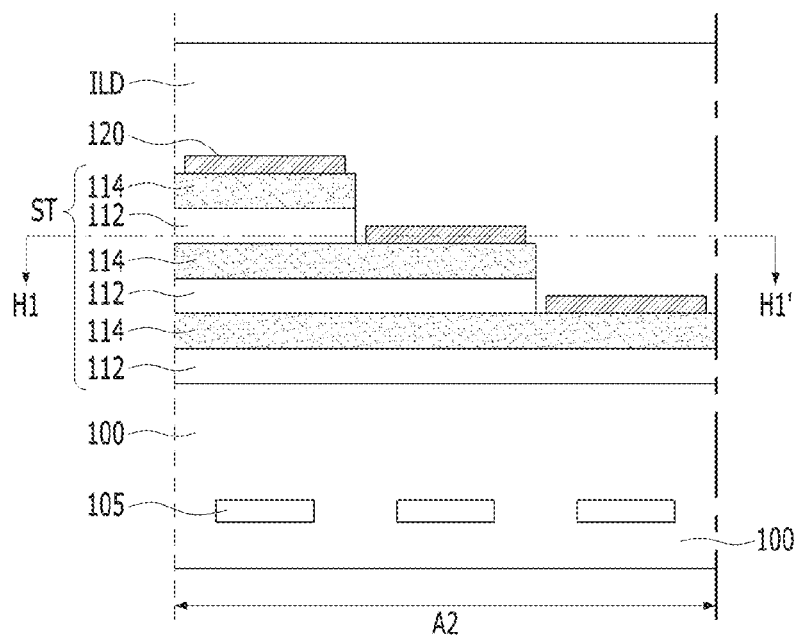
Figure 4B:
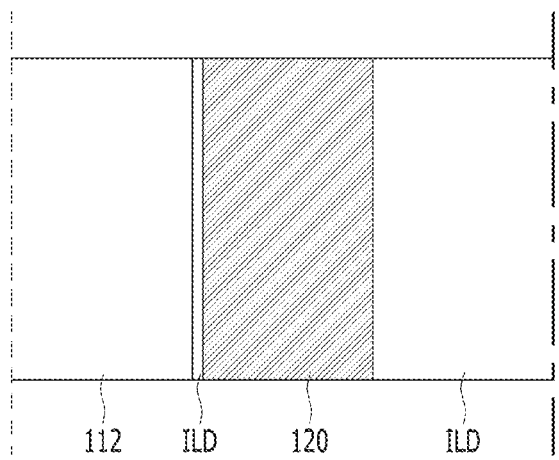

Referring to FIGS. 4A and 4B, a sacrificial pad 120 may be formed on the exposed surface of each of the sacrificial layers 114. The sacrificial pad 120 is a layer to be replaced by a conductive material which is connected to the gate electrode layers of the memory cells, and it may be removed before or after a subsequent process of removing the sacrificial layers 114. The sacrificial pad 120 may be formed of various materials having an etch rate different from those of the sacrificial layers 114 and the inter-gate dielectric layers 112. The reason is to prevent the inter-gate dielectric layers 112 from being lost during a subsequent process of removing the sacrificial pad 120 while preventing the sacrificial pad 120 from being lost during a subsequent process of recessing the sacrificial layers 114. In an example, if the inter-gate dielectric layers 112 include silicon oxide and the sacrificial layer 114 includes silicon nitride, the sacrificial pad 120 may include polysilicon. However, these materials may be selected in various combinations, as long as the inter-gate dielectric layers 112, the sacrificial layers 114 and the sacrificial pad 120 have different etch rates while the inter-gate dielectric layers 112 include a dielectric material.

The sacrificial pad 120 on any sacrificial layer 114 should not come into contact with a sacrificial layer 114 positioned immediately above it. For this, the thickness of the sacrificial pad 120 and/or its distance from the inter-gate dielectric layer 112 may be suitably controlled. For example, the sacrificial pad 120 may be spaced apart at a predetermined distance from the inter-gate dielectric layer 112 whose bottom surface is positioned at the same height as the sacrificial pad 120. Alternatively, the thickness of the sacrificial pad 120 may be less than that of the inter-gate dielectric layer 112 whose bottom surface is positioned at the same height as the sacrificial pad 120. Alternatively, the sacrificial pad 120 may be spaced apart at a predetermined distance from the inter-gate dielectric layer 112 whose bottom surface is positioned at the same height as the sacrificial pad 120, and at the same time, may have a smaller thickness than this inter-gate dielectric layer 112.

Here, a process of forming the sacrificial pad 120 may be performed in various manners. In one example, although not shown in the figure, the sacrificial pad 120 may be formed by: depositing a sacrificial layer for forming the sacrificial pad 120 along the surface of the stepped structure shown in FIGS. 3A and 3B; forming a passivation layer along the surface of the deposited sacrificial layer by depositing a material having poor step coverage characteristics to form the passivation layer having a large thickness on the top surface of the stepped structure and a small thickness on the sidewall of the stepped structure; isotropically etching the passivation layer to expose the sacrificial layer on the sidewall of the stepped structure, thereby allowing the passivation layer to remain only on the top surface of the stepped structure; removing the exposed sacrificial layer on the sidewall of the stepped structure by isotropic etching, thereby allowing the sacrificial layer to remain only on the top surface of the stepped structure; and removing the passivation layer. Here, the thickness of the sacrificial pad 120 or its distance from the inter-gate dielectric layer 112 may be controlled by controlling the degree of isotropic etching during removal of the sacrificial layer.

Next, an interlayer dielectric layer ILD covering the stack structure ST having the sacrificial pad 120 formed thereon may be formed over the substrate 100. In an example, the interlayer dielectric layer ILD may include silicon oxide.

Figure 5A:
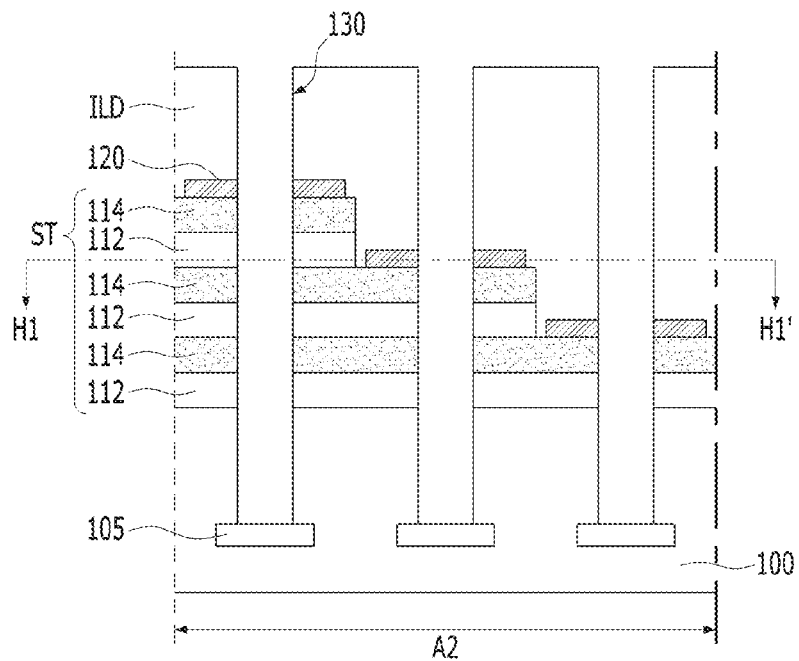
Figure 5B:
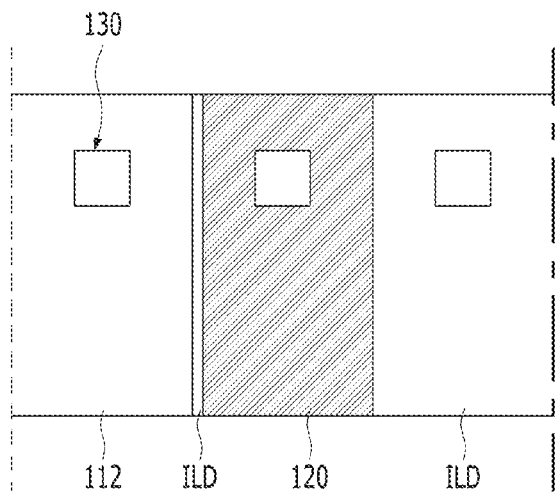

Referring to FIGS. 5A and 5B, contact holes 130 may be formed, which provide spaces in which contact plugs that are respectively connected to the gate electrode layers of the memory cell are to be formed.

When viewed from the top, each of the contact holes 130 may be formed at a position overlapping with a protrusion of each sacrificial layer 114 and/or each sacrificial pad 120, similar to that described above with reference to FIGS. 2A and 2B. Furthermore, when viewed from the top, each of the contact holes 130 may be formed at a position overlapping with the corresponding peripheral circuit element 105. The peripheral circuit element 105 may be one junction of a switching transistor, or a pad or wiring that is connected to one junction of the switching transistor.

When viewed in cross-section, each of the contact holes 130 may be formed to have a depth passing through all the interlayer dielectric layer ILD, the sacrificial pad 120 and the stack structure ST, differently from that described above with reference to FIGS. 2A and 2B. Furthermore, in an embodiment, each of the contact holes 130 may be formed to have a depth exposing the peripheral circuit element 105 formed in the substrate 100. Formation of such contact holes 130 may be performed by selectively etching the interlayer dielectric layer ILD, the sacrificial pad 120, the stack structure ST and the substrate 100 until the peripheral circuit element 105 is exposed. That is, in an embodiment, etching is not stopped on the sacrificial pad 120 and/or the sacrificial layer 114, but punching may be intentionally induced.

Figure 6A:
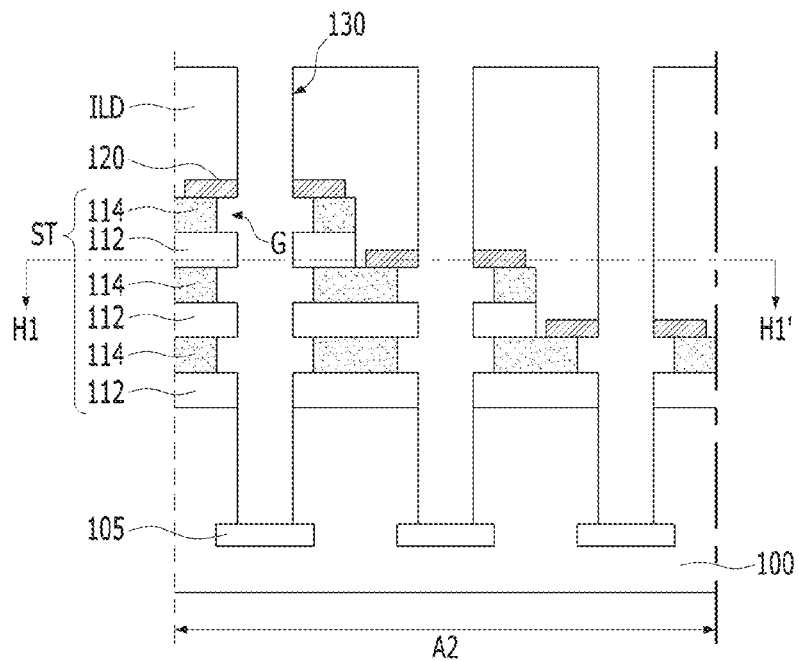
Figure 6B:
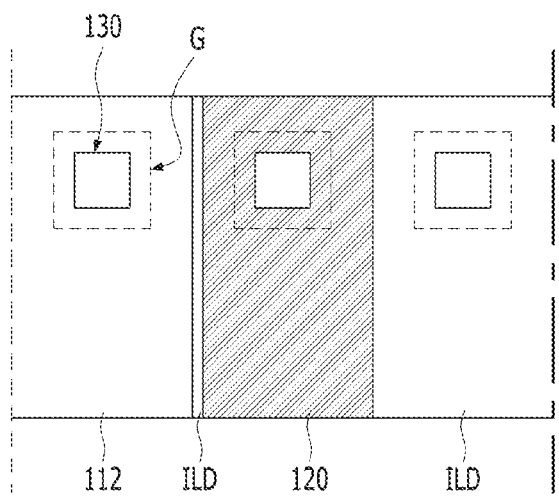

Referring to FIGS. 6A and 6B, the sacrificial layers 114 exposed through the contact holes 130 may be partially recessed. Recessing of the sacrificial layers 114 may be performed by isotropic etching.

The spaces formed by recessing the sacrificial layers 114 will hereinafter be referred to as the grooves G. The grooves G may have a shape surrounding the side surface of the contact hole 130 at a position corresponding to each sacrificial layer 114 (see the dotted line in FIG. 6B). In addition, the distance from the side surface of the contact hole 130 to the side surface of the groove G may be smaller than the distance from the side surface of the contact hole 130 to the side surface of the sacrificial pad 120. Accordingly, the sacrificial layer 114 and the sacrificial pad 120 may be connected to each other in spite of formation of the grooves G.

As described above, the sacrificial layer 114 has an etch rate different from those of the inter-gate dielectric layer 112 and the sacrificial pad 120, and hence it may be possible to prevent the inter-gate dielectric layer 112 and the sacrificial pad 120 from being lost during recessing of the sacrificial layer 114.

Figure 7A:
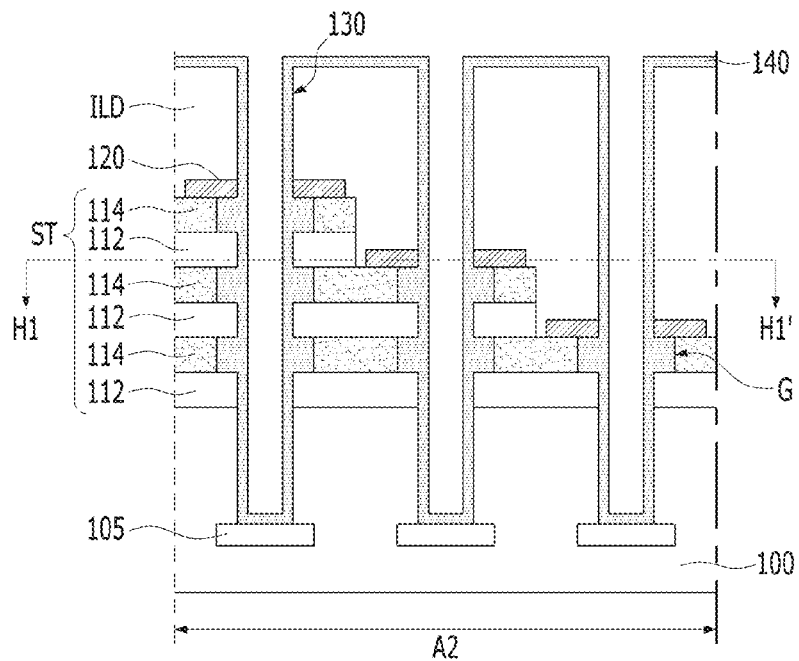
Figure 7B:
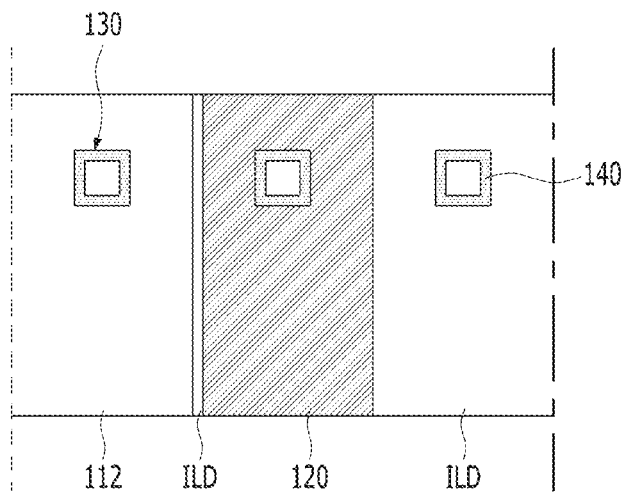

Referring to FIGS. 7A and 7B, a sealing layer 140 may be formed along the entire surface of the structure resulting from the process shown in FIGS. 6A and 6B. The sealing layer 140 may be formed to have a thickness that sufficiently fills the grooves G.

Here, the sealing layer 140 serves to prevent the physical and electrical connection between the gate electrode layer and the contact plug in subsequent processes of replacing the sacrificial layer 114 with the gate electrode layer and filling the contact hole 130 with the contact plug, and may be formed of various dielectric materials. Furthermore, since the sealing layer 140 should not be lost during subsequent processes of removing the sacrificial layer 114 and removing the sacrificial pad 120, it may be formed of a material having an etch rate different from those of the sacrificial layer 114 and the sacrificial pad 120. In an example, the sealing layer 140 may include silicon oxide.

Figure 8A:
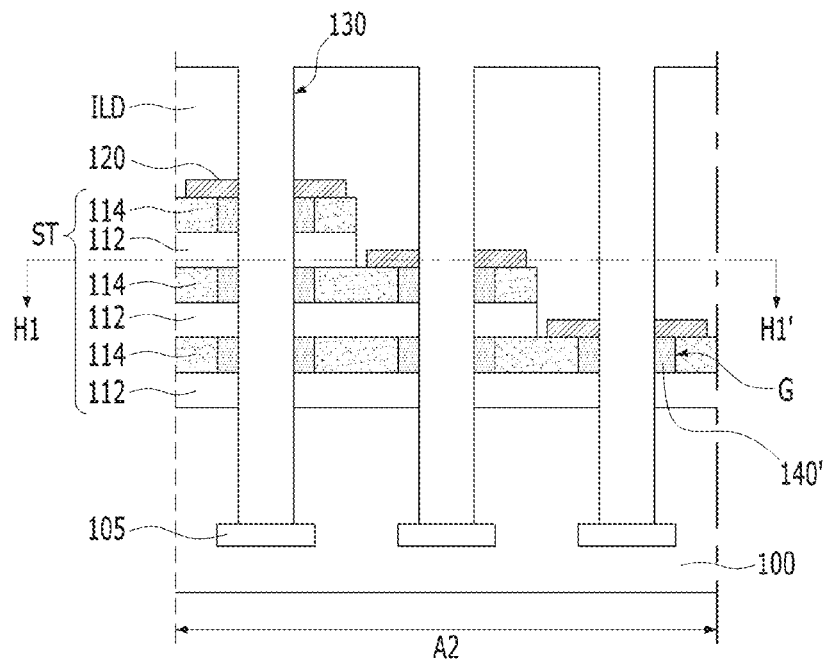
Figure 8B:
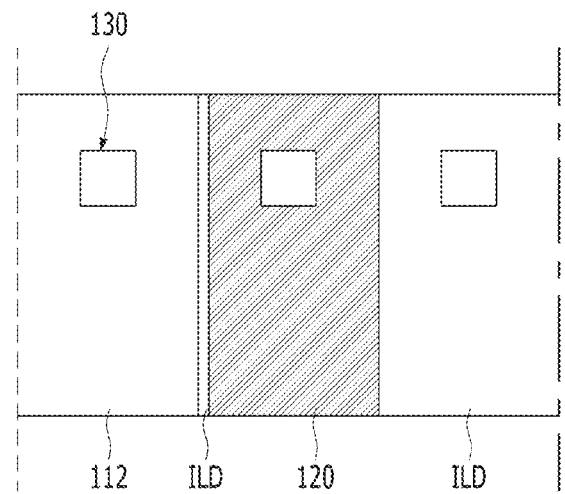

Referring to FIGS. 8A and 8B, an etch-back process may be performed on the sealing layer 140 to form a sealing layer pattern 140' remaining only in the groove G.

The etch-back process may be performed such that the sealing layer 140 on the sidewall of the contact hole 130 and the sealing layer 140 on the top surface of the peripheral circuit element 105 may be sufficiently removed. Accordingly, the side surface of the sacrificial pad 120 and the top surface of the peripheral circuit element 105 may be exposed.

The sealing layer pattern 140' may have a shape surrounding the side surface of the contact hole 130 at a position corresponding to each sacrificial layer 114. That is, the sealing layer pattern 140' may have the same thickness at the same height as each sacrificial layer 114. In addition, the width of the sealing layer pattern 140', that is, the distance from the side surface of the contact hole 130 to the outer side surface of the sealing layer pattern 140', may be smaller than the X-direction width of the sacrificial pad 120, that is, the width from the side surface of the contact hole 130 to the side surface of the sacrificial pad 120 in the X-direction.

Figure 9A:
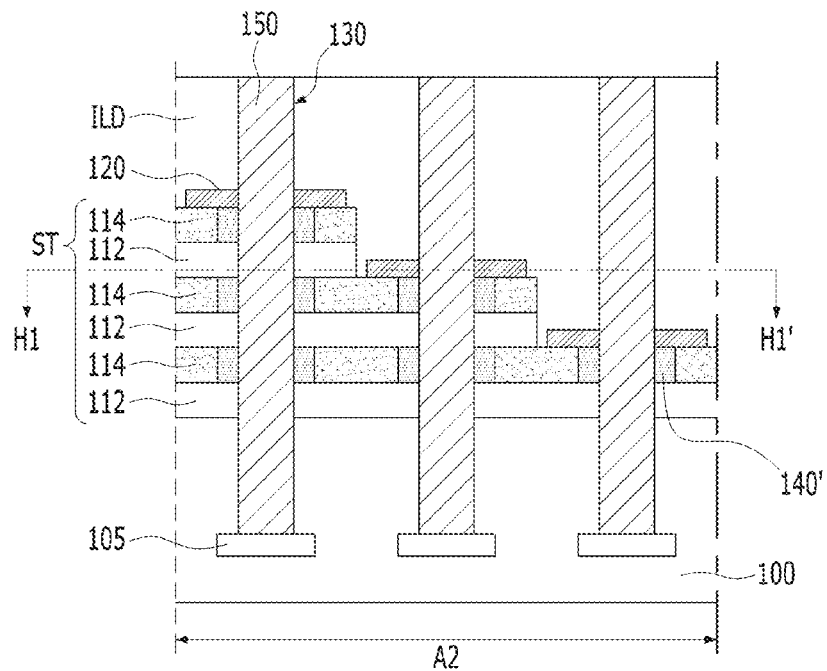
Figure 9B:
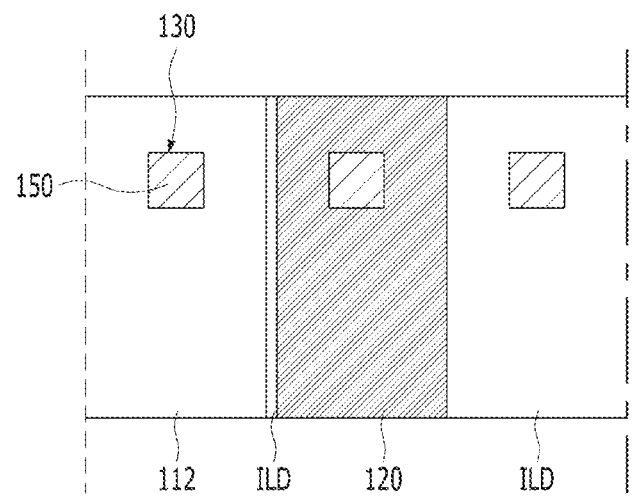

Referring to FIGS. 9A and 9B, a contact plug 150 filling each contact hole 130 may be formed.

The contact plug 150 may have a thickness that sufficiently fills the contact hole 130. It may be formed by depositing a conductive material, such as a metal, a metal nitride or a combination thereof, and then performing a planarization process, for example, a CMP (Chemical Mechanical Polishing) process, until the top surface of the interlayer dielectric layer ILD is exposed.

Each of the contact plugs 150 may pass through the interlayer dielectric layer ILD, the sacrificial pad 120, the stack structure ST and a portion of the substrate 100, and may be connected directly to the corresponding peripheral circuit element 105.

Figure 10A:
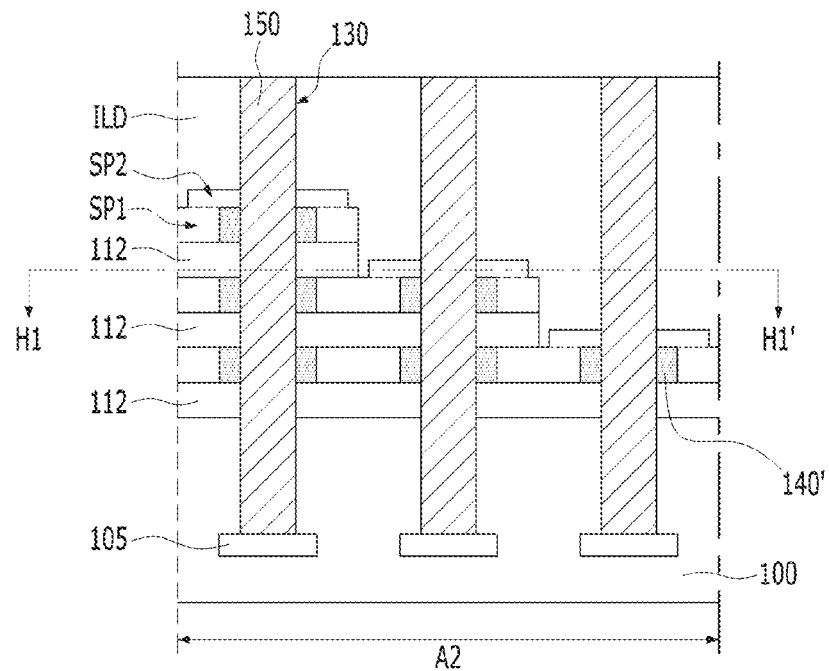
Figure 10B:
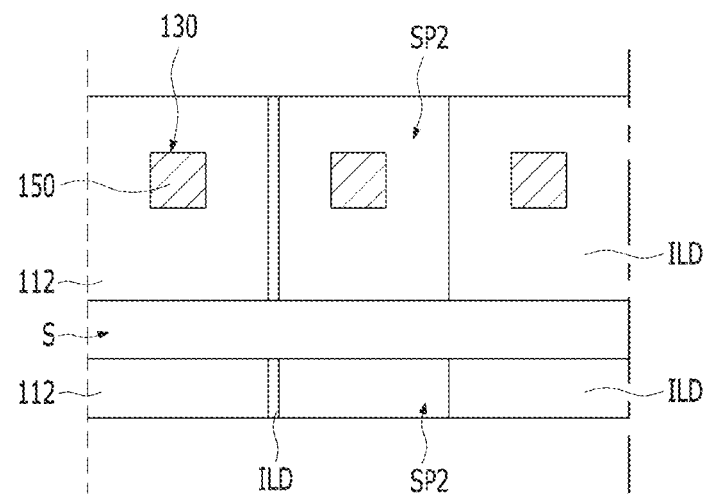

Referring to FIGS. 10A and 10B, the stack structure ST may be selectively etched to form a slit S in the stack structure ST.

The slit S may extend in the X-direction, and by this slit S, the stack structure ST may be separated into a plurality of structures in the Y-direction. The slit S may be formed to have a depth that passes through at least the lowest sacrificial layer 114 in the stack structure ST. Furthermore, the slit S may be formed simultaneously with a cell array region slit (not shown) or may be formed separately.

Next, the sacrificial layers 114 exposed through the slit S may be removed. Removal of the sacrificial layers 114 may be performed by an isotropic etching method such as wet etching. During removal of the sacrificial layers 114, the inter-gate dielectric layer 112, the sacrificial pad 120 and the sealing layer pattern 140', which have etch rates different from that of the sacrificial layers 114, may be prevented from being lost. Even though the sacrificial layers 114 are removed, a portion of the sidewall of the contact plug 150, which corresponds to each sacrificial layer 114, may not be exposed since it is surrounded by the sealing layer pattern 140'. The space formed by removal of the sacrificial layer 114 will hereinafter be referred to as first space SP1.

Then, the sacrificial pad 120 exposed through the slit S may be removed. Removal of the sacrificial pad 120 may also be performed by an isotropic etching method such as wet etching. During removal of the sacrificial pad 120, the inter-gate dielectric layer 112 and the sealing layer pattern 140', which have etch rates different from that of the sacrificial pad 120, may be prevented from being lost. By removal of the sacrificial pad 120, a portion of the sidewall the contact plug 130, which corresponds to each sacrificial pad 120, may be exposed. The space formed by removal of the sacrificial pad 120 will hereinafter be referred to as the second space SP2.

In an embodiment, the sacrificial layer 114 is removed first and the sacrificial pad 120 is removed later, but the removal order can be reversed.

Although not shown in the figure, if the whole or a portion of the memory layer ML is not formed in the cell array region, the process of forming the slit S and the process of removing the sacrificial layers 114 may be performed separately in the cell array region and the contact region A2. In other words, the processes of forming the slit S in the cell array region and removing the sacrificial layers 114 may be performed first and the processes of forming the slit S in the contact region A2 and removing the sacrificial layers 114 may be performed later, or vice versa. After the processes of forming the slit in the cell array region and removing the sacrificial layers 114 and before the subsequent process shown in FIGS. 11A and 11B, a portion or the whole of the memory layer ML, which has not been formed, may be formed along the inner walls of the spaces from which the sacrificial layers 114 have been removed.

Figure 11A:
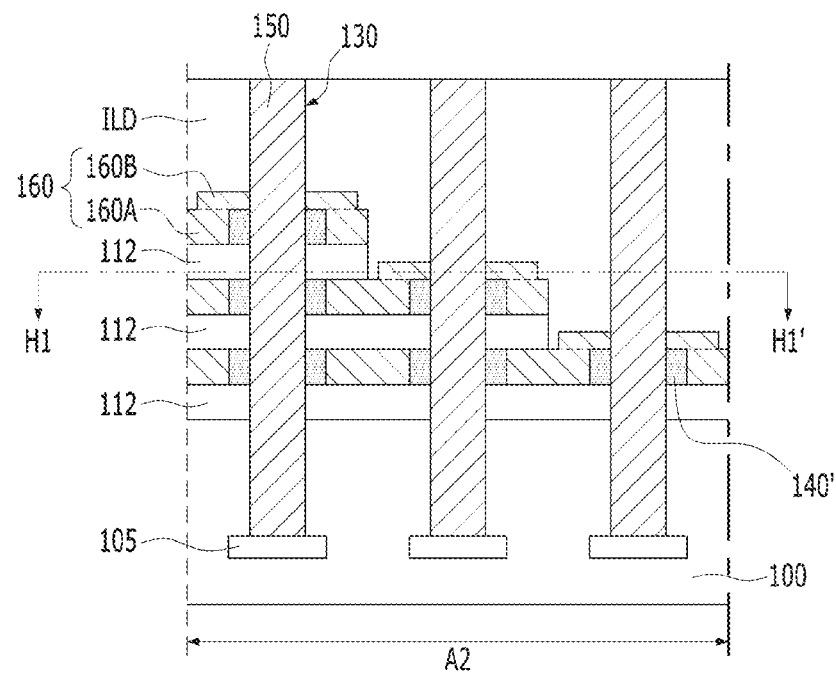
Figure 11B:
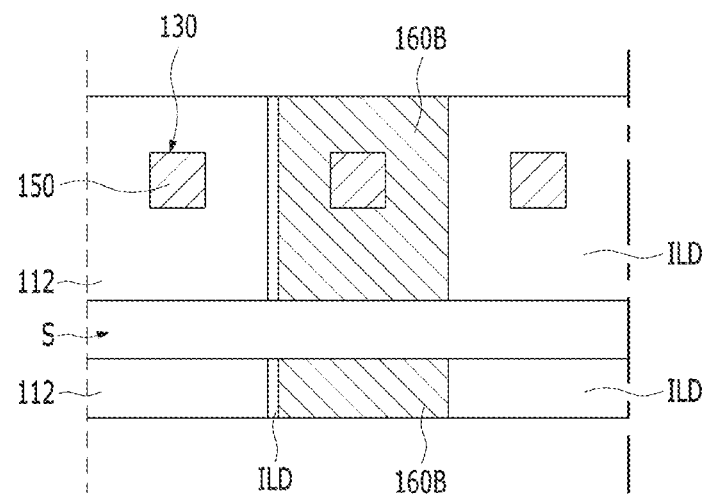

Referring to FIGS. 11A and 11B, the first and second spaces SP1 and SP2 may be filled with a conductive material to form a conductive pattern 160.

Formation of the conductive pattern 160 may be performed by depositing a conductive material, such as a metal, a metal nitride or a combination thereof, on the structure resulting from the process shown in FIGS. 10A and 10B, to a thickness that sufficiently fills the first and second spaces SP1 and SP2, and then performing an etch-back process such that the conductive material remains only in the first and second spaces SP1 and SP2.

The conductive pattern 160 may be divided into a first conductive pattern 160A, filling the first space SP1, and a second conductive pattern 160B filling the second space SP2. The first conductive pattern 160A may function as the gate electrode layer of the memory cell. The second conductive pattern 160B may function as a connection portion that connects any gate electrode layer of the memory cell to the corresponding contact plug 130. That is, the uppermost second conductive pattern 160B may connect the uppermost first conductive pattern 160A to the leftmost contact plug 150; the second uppermost second conductive pattern 160B may connect the second uppermost first conductive pattern 160A to the second contact plug 150 from the left side; and the lowest second conductive pattern 160B may connect the lowest first conductive pattern 160A to the rightmost contact plug 150.

In this case, although the contact plug 150 is formed to completely pass through a first stack structure ST, it may be separated from the first conductive pattern 160A by the sealing layer pattern 140'. However, it may be connected to the first conductive pattern 160A of the layer to be connected, through the second conductive pattern 160B formed thereon.

As a result, a memory device including the contact region A2 structure as shown in FIGS. 11A and 11B may be fabricated.

Referring to FIGS. 11A and 11B again, the memory device of an embodiment may include: the substrate 100 including the peripheral circuit element 105; a stack structure which is formed on the substrate 100 and in which the inter-gate dielectric layers 112 and the first conductive patterns 160A are alternatively stacked, in which the stack structure has a stepped shape such that any first conductive pattern 160A has a portion that further protrudes than the first conductive pattern 160A positioned immediately above it; the second conductive pattern 160B formed on the protrusion of each first conductive pattern 160A; the contact plug 150 which passes through the stack structure in which each second conductive pattern 160B, the inter-gate dielectric layer 112 and the first conductive pattern 160A are alternatively stacked and the substrate 100, and is connected to the corresponding peripheral circuit element 105; and the sealing layer pattern 140' which is interposed between each first conductive pattern 160A and the contact plug 150 and physically and electrically separates them. Here, the distance from the sidewall of the contact plug 150 to the side surface of the sealing layer pattern 140' may be smaller than the distance from the side surface of the contact plug 150 to the side surface of the second conductive pattern 160B, and thus a portion of the top surface of the first conductive pattern 160A may be in direct contact with a portion of the bottom surface of the second conductive pattern 160B.

Here, the contact plug 150 to be connected to the first conductive pattern 160A of any one layer may be connected to the corresponding first conductive pattern 160A through the second conductive pattern 160B, which is disposed on the corresponding first conductive pattern 160A and is in direct contact therewith, instead of being in direct contact with the corresponding first conductive pattern 160A, and it may be separated from the first conductive patterns 160A of the remaining layers by the sealing layer pattern 140'.

Furthermore, the bottom surface of this contact plug 150 may be connected directly to the peripheral circuit element 105 to be connected. In an example, the left contact plug 150 connected to the uppermost first conductive pattern 160A may be separated from the uppermost first conductive pattern 160A by the sealing layer pattern 140', and a portion of the side surface thereof may be connected to the second conductive pattern 160B, which is positioned on the uppermost first conductive pattern 160A and is in contact therewith, and the bottom surface thereof may be connected to the left peripheral circuit element 105. As a result, a current path may be generated, which passes through the uppermost first conductive pattern 160A, the second conductive pattern 160B thereon, the left contact plug 150, and the left peripheral circuit element 105.

According to the embodiments described above, the following advantages may be obtained.

First, during formation of the contact hole 130, etching does not need to be stopped on each sacrificial layer 114 and/or each sacrificial pad 120, and thus punching failure may be fundamentally prevented. In addition, since etching does not need to be precisely controlled such that the etching is stopped on each sacrificial layer 114 and/or each sacrificial pad 120, process difficulty may be reduced.

Furthermore, in an embodiment, a peripheral circuit region in which the peripheral circuit element 105 is formed may be disposed below the stack structure of the contact region A2, and thus the area of the memory device may be reduced.

Furthermore, since the bottom surface of the contact plug 150 connected to each of the first conductive patterns 160A functioning as gate electrode layers is connected directly to the peripheral circuit element 105, there is an advantage in that formation of an additional connecting member is not necessary. If the bottom surface of the contact plug 150 is not connected directly to the peripheral circuit element 105, for example, if the bottom surface of the contact plug C contacts each gate electrode layer GE as in the embodiment shown in FIGS. 2A and 2B, formation of various connecting members, such as a contact plug, a pad and a wiring, which connect the top surface of the contact plug C to the peripheral circuit element, may be necessary in order to connect the contact plug C to the peripheral circuit element. However, in an embodiment, the contact plug 150 may perform both the function of connecting to the gate electrode layer and the function of connecting to the peripheral circuit element, and thus formation of such additional connecting members may be omitted.

However, in an embodiment, the peripheral circuit element might not be disposed under the contact plug, and thus the contact plug may perform only the function of connecting to the gate electrode layer without being directly connected to the peripheral circuit element. This will be described below by way of example with reference to FIGS. 12A and 12B.

Figure 12A:
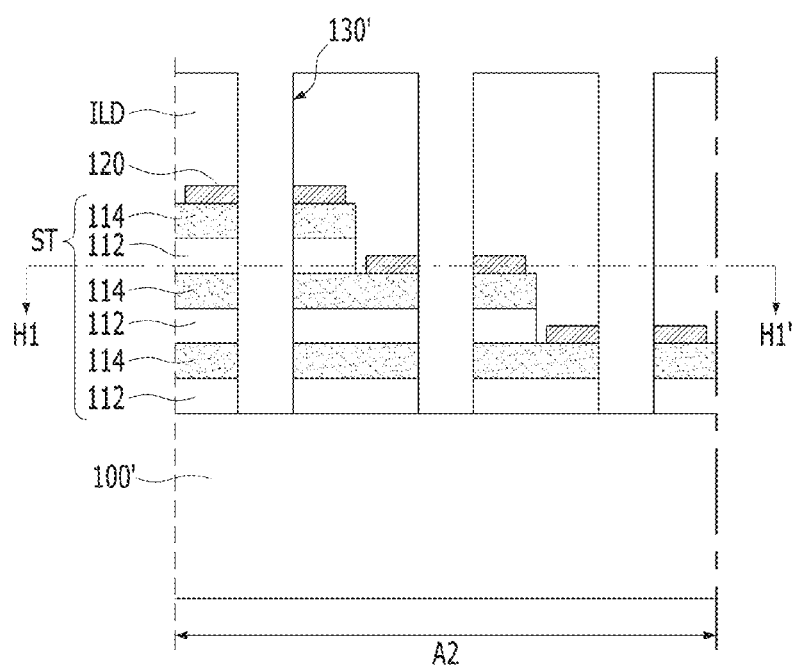
FIGS. 12A and 12B are sectional views illustrating a memory device and a method for fabricating the same according to another embodiment of the present disclosure.
Figure 12B:
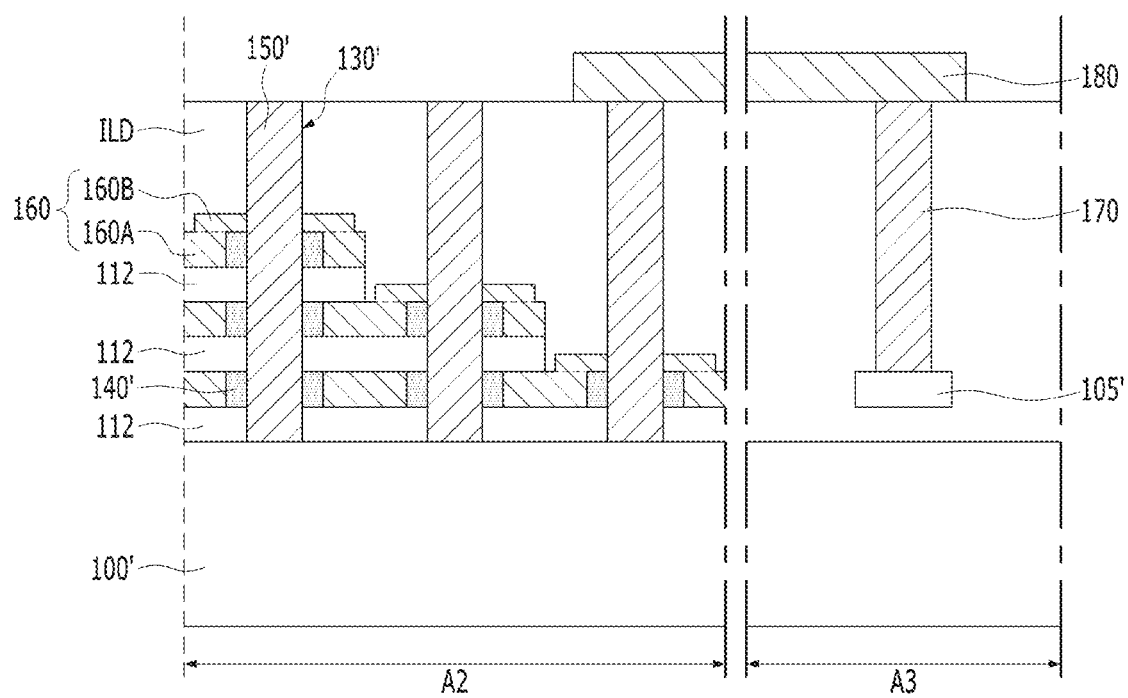

FIGS. 12A and 12B are sectional views illustrating a memory device and a method for fabricating the same according to another embodiment of the present disclosure. FIG. 12A is a sectional view illustrating a case in which the depth of the contact hole in the process shown in FIG. 5A is changed, and FIG. 12B is a sectional view illustrating a memory device fabricated according to a subsequent process after the process shown in FIG. 12A, and further illustrating, particularly, a peripheral circuit region A3.

Referring to FIG. 12A, a substrate 100' may be provided. The substrate 100' may include various elements, but may not include a peripheral circuit element to be connected to at least a contact plug.

Then, on the substrate 100', there may be formed a stack structure ST in which a plurality of inter-gate dielectric layers 112 and a plurality of sacrificial layers 114 are alternately stacked and which is patterned to have a stepped shape, a sacrificial pad 120 which is positioned on a protrusion of each of the sacrificial layers 114, and an interlayer dielectric layer ILD which covers the stack structure ST and the sacrificial pads 120.

Then, contact holes 130' may be formed, which pass through the interlayer dielectric layer ILD, the sacrificial pads 120 and the stack structure ST. Since no peripheral circuit element is present in the substrate 100', the depth of the contact holes 130' may be variously adjusted on the premise that the contact holes pass through the stack structure ST. In an example, as shown in the figure, the contact holes 130' may have a depth that passes through the stack structure ST and exposes the substrate 100', and the depth of the contact holes 130' may be uniform. That is, the bottom levels of the plurality of contact holes 130' may be substantially identical to each other. However, in other embodiments, the bottom levels of the plurality of contact holes 130' may also differ from each other on the premise that they pass through the stack structure ST.

Next, subsequent processes that are substantially the same as those in the above-described embodiments, that is, the processes shown in FIGS. 6A and 6B through FIGS. 11A to 11B, may be performed, thereby forming the memory device shown in FIG. 12B.

Referring to FIG. 12B, in the contact region A2, contact plugs 150' may be formed which have a bottom level different from that of the contact plugs 150 shown in FIG. 11A. Since no peripheral circuit element is present below the contact plugs 150', the contact plugs 150' may not be connected directly to the peripheral circuit element. For this reason, a process of connecting the contact plugs 150' to the peripheral circuit element 105' of the peripheral circuit region A3 may be necessary.

In an example, the peripheral circuit region A3 may be disposed adjacent to one side of the contact region A2 or disposed to be spaced apart from the contact region A2, and the peripheral circuit element 105' may be formed on the substrate 100' in the peripheral circuit region A3. As described above, the peripheral circuit element 105' may be one junction of a switching transistor, or a pad or wiring connected thereto.

The contact plug 150' may be connected to a conductive pattern connected to the top surface thereof, for example, a wiring 180. This wiring 180 may extend to the peripheral circuit region A3 and may be connected to a peripheral contact plug 170, which passes through the interlayer dielectric layer ILD of the peripheral circuit region A3 and is connected to the peripheral circuit element 105'.

As a result, a current path may be generated which passes through the contact plug 150', the wiring 180, the peripheral contact plug 170 and the peripheral circuit element 105'.

In these embodiments, the effect of preventing punching failure and reducing the difficulty of the etching process may be obtained.

FIGS. 13A and 13B through FIGS. 17A and 17B are views illustrating a memory device and a method for fabricating the same according to another embodiment of the present disclosure. In FIGS. 13A and 13B through FIGS. 17A and 17B, each figure with A next to the number is a sectional view, and each figure with B next to the number is a top view taken along line H1-H1' of each figure with A next to the number. The following description will focus on differences from the above-described embodiment of FIGS. 3A and 3B through FIGS. 11A and 11B.

Figure 13A:
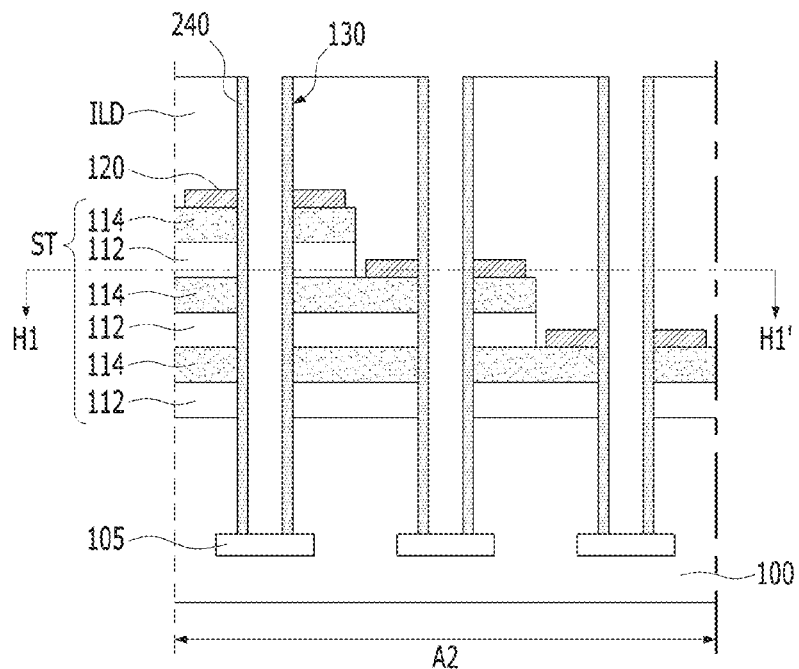
FIGS. 13A, 13B, 14A, 14B, 15A, 15B, 16A, 16B, 17A, and 17B are views illustrating a memory device and a method for fabricating the same according to another embodiment of the present disclosure.
Figure 13B:
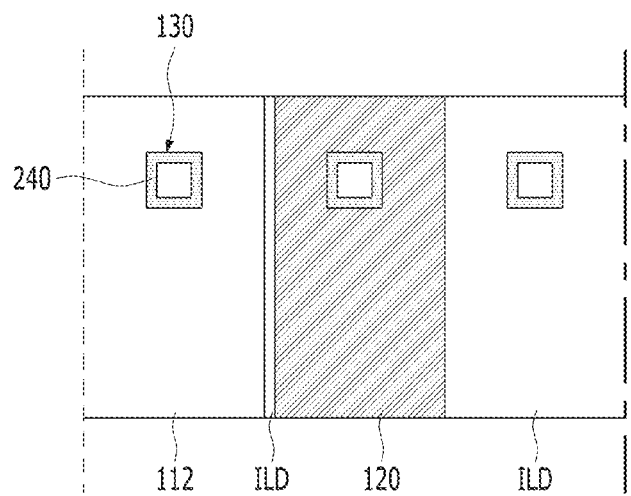

Referring to FIGS. 13A and 13B, substantially the same processes as described above with reference to FIGS. 3A and 3B through FIGS. 5A and 5B are performed, and then a sealing layer 240 may be formed on the sidewall of each contact hole 130.

The sealing layer 240 may be formed of various dielectric materials. In particular, it may include a material (e.g., silicon oxide) having an etch rate different from those of sacrificial layers 114 and sacrificial pads 120.

Formation of the sealing layer 240 may be performed by depositing a dielectric material along the structure resulting from the process shown in FIGS. 5A and 5B to a small thickness that does not completely fill the contact hole 130, and then performing an etch-back process to remove the dielectric material from the top of the interlayer dielectric layer ILD and the bottom of the contact hole 130. Accordingly, the peripheral circuit element 105 may be exposed through the bottom of the contact hole 130.

Figure 14A:
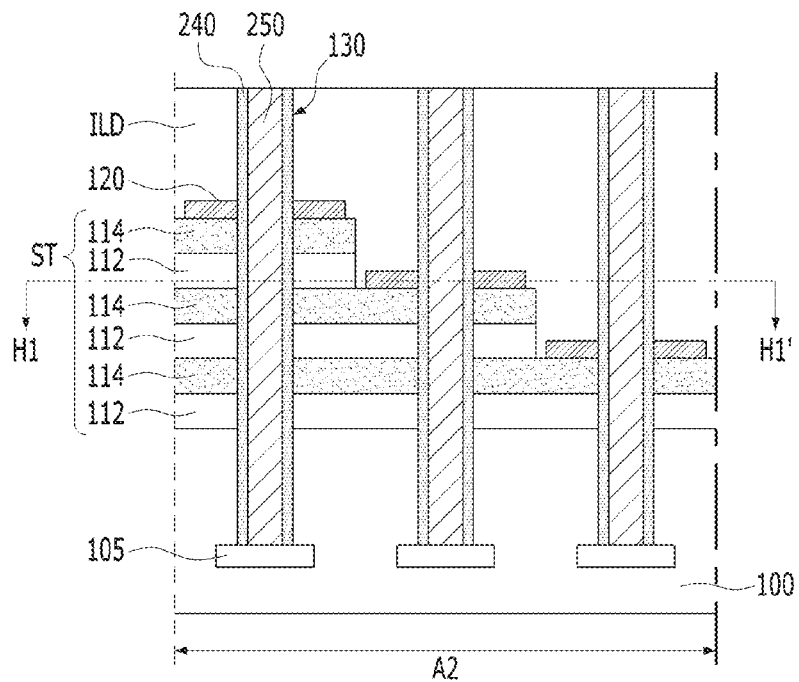
Figure 14B:
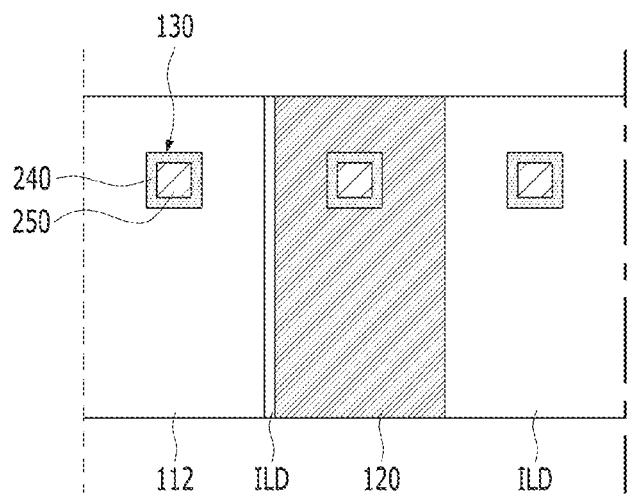

Referring to FIGS. 14A and 14B, a contact plug 250 filling each contact hole 130 having the sealing layer 240 formed thereon may be formed.

The contact plug 250 may be formed by depositing a conductive material, such as a metal, a metal nitride or a combination thereof, to a thickness that sufficiently fills the contact hole 130 having the sealing layer 240 formed thereon, and then performing a planarization process until the top surface of the interlayer dielectric layer ILD is exposed.

By this process, the entire sidewall of the contact plug 250 may be surrounded by the sealing layer 240, whereby the contact plug 250 may be separated from the sacrificial layer 114 and the sacrificial pad 120.

Figure 15A:
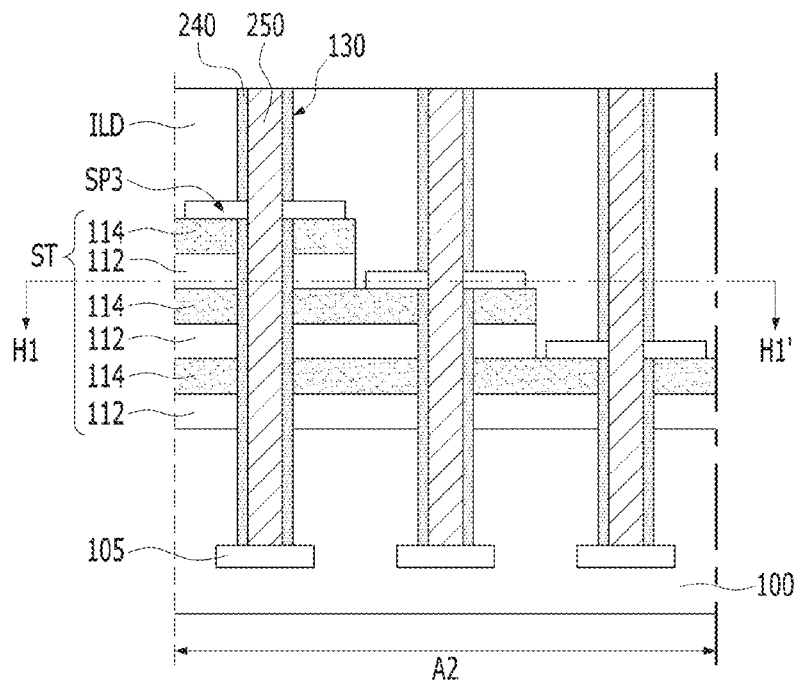
Figure 15B:
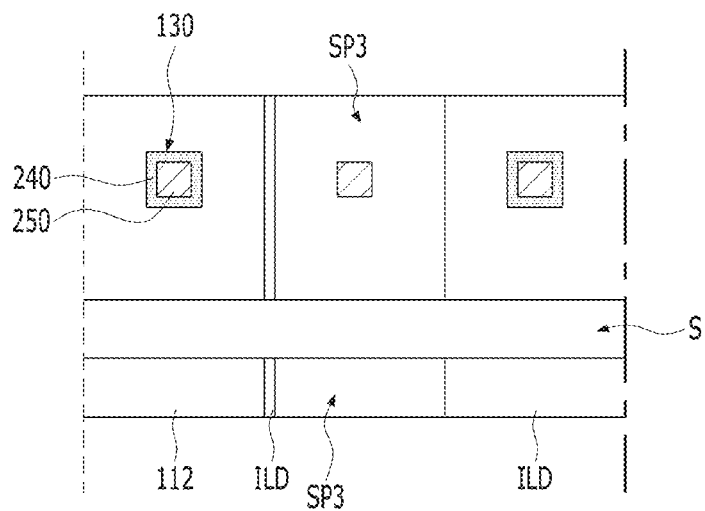

Referring to FIGS. 15A and 15B, the stack structure ST may be selectively etched to form a slit S that extends in the X-direction while having a depth that passes through at least the lowest sacrificial layer 114.

Next, the sacrificial pad 120 exposed through the slit S may be removed, and then a portion of the sealing layer 240, exposed by removal of the sacrificial pad 120, may also be removed. The space formed by removal of the sacrificial pad 120 and the sealing layer 240 will hereinafter be referred to as the third space SP3. By formation of the third space SP3, a portion of the sidewall of the contact plug 250, which faces the sacrificial pad 120, may be exposed.

Figure 16A:
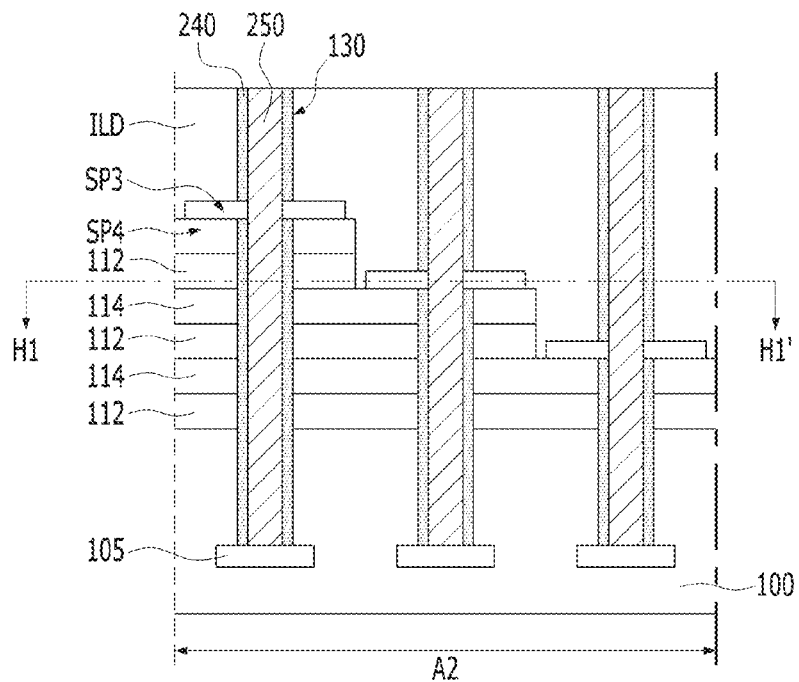
Figure 16B:
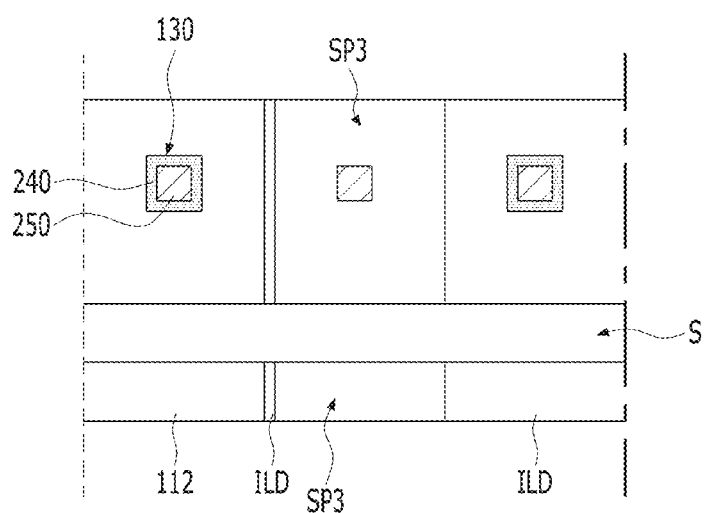

Referring to FIGS. 16A and 16B, the sacrificial layer 114 exposed through the slit S may be removed. The space formed by removal of the sacrificial layer 114 will hereinafter be referred to as the fourth space SP4.

In an embodiment, the process of removing the sacrificial pad 120 and a portion of the sealing layer 240 is performed first and the process of removing the sacrificial layer 114 is performed later. However, the sequence of these removal processes may also be reversed.

Figure 17A:
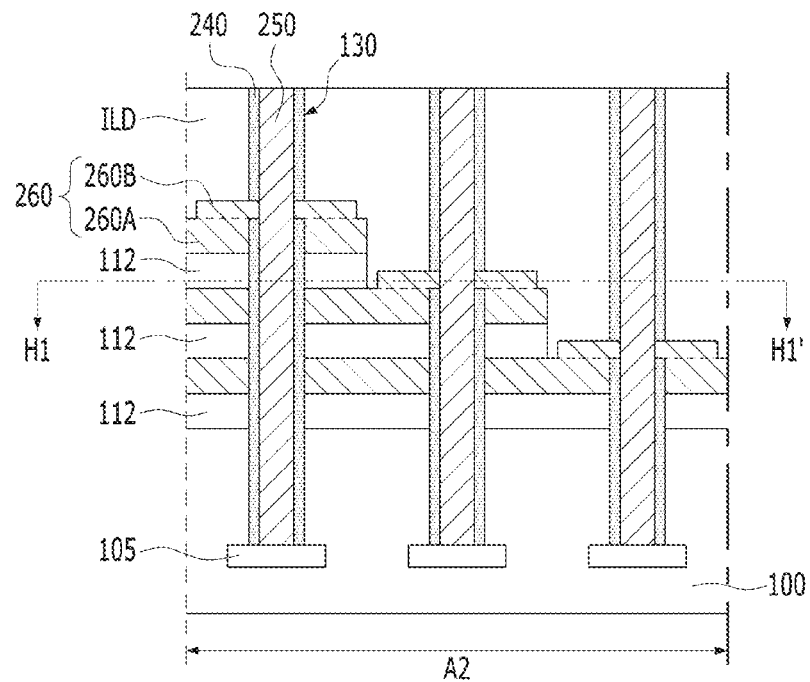
Figure 17B:
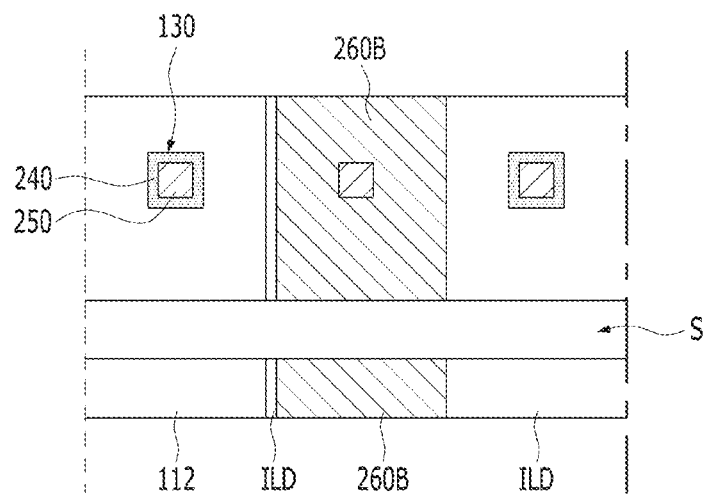

Referring to FIGS. 17A and 17B, the third and fourth spaces SP3 and SP4 may be filled with a conductive material to form a conductive pattern 260.

The conductive pattern 260 may include a first conductive pattern 260A, filling the fourth space SP4, and a second conductive pattern 260B filling the third space SP3. The first conductive pattern 260A may function as the gate electrode layer of the memory cell. The second conductive pattern 260B may function as a connection portion that connects any gate electrode layer of the memory cell to the corresponding contact plug 250.

As a result, a memory device including the structure of the contact region A2 as shown in FIGS. 17A and 17B may be fabricated.

Referring to FIGS. 17A and 17B again, the memory device of these embodiments may include: the substrate 100 including the peripheral circuit element 105; a stack structure which is formed on the substrate 100 and in which the inter-gate dielectric layer 112 and the first conductive pattern 260A are alternatively stacked, in which the stack structure has a stepped shape such that any first conductive pattern 260A has a portion that further protrudes than the first conductive pattern 260A positioned immediately above it; the second conductive pattern 260B formed on a protrusion of each first conductive pattern 260A; the contact plug 250 which passes through the stack structure in which each second conductive pattern 260B, the first conductive pattern 260A and the inter-gate dielectric layer 112 are alternately stacked and the substrate 100, and is connected to the corresponding peripheral circuit element 105; and the sealing layer 240 which is interposed between each first conductive pattern 260A and the contact plug 250 and physically and electrically separates them.

Here, the main difference from the memory device of FIGS. 11A and 11B lies in the shape of the sealing layer 240. For example, in the memory device of FIGS. 11A and 11B, the sealing layer pattern 140' is interposed only between the first conductive pattern 160A and the contact plug 150. That is, the sealing layer pattern 140' may have the same thickness as that of the first conductive pattern 160A while being positioned at the same height as the first conductive pattern 160A. However, in an embodiment, the sealing layer 240 may completely surround the sidewall of the contact plug 150, except for between the second conductive pattern 260B and the contact plug 250.

The contact plug 250 to be connected to the first contact pattern 260A of any one layer may be connected to the corresponding first conductive pattern 260A through the second conductive pattern 260B, which is disposed on the corresponding first conductive pattern 260A and is in direct contact therewith, instead of being connected directly to the corresponding first conductive pattern 260A, and it may be separated from the first conductive patterns 260A of the remaining layers through the sealing layer 240'. As a result, similar effects as those obtained in the embodiment of FIGS. 3A and 3B through FIGS. 11A and 11B may be obtained.

Meanwhile, in the above-described embodiments, after the process of removing the sacrificial layers 114 and before the process of filling the spaces, from which the sacrificial layers have been removed, with the conductive material, the channel pillars of the cell array region and the contact plugs of the contact region may function to support the stack structure having the spaces from which the sacrificial layers 114 have been removed.

An example of a memory device and a method for fabricating the same, which can further enhance this supporting function, will be described.

FIGS. 18A and 18B through 24A and 24B are illustrating a memory device and a method for fabricating the same according to an embodiment of the present disclosure. In FIGS. 18A and 18B through 24A and 24B, each figure with A next to the number is a sectional view, and each figure with B next to the number is a top view taken along line H1-H1' of each figure with A next to the number. Furthermore, each sectional view illustrates a section taken along line A-A' of the top view together with a section taken along line B-B' thereof. The following description will exclude repetitive descriptions that were discussed with regard to the embodiments described above with reference to FIGS. 3A and 3B through 11A and 11B.

Figure 18A:
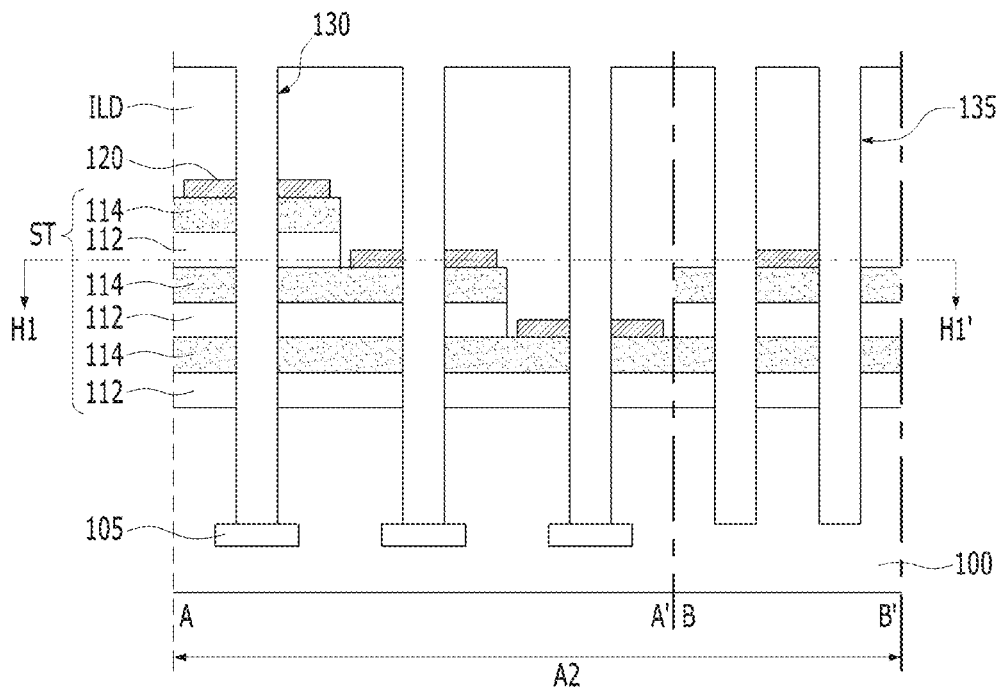
FIGS. 18A, 18B, 19A, 19B, 20A, 20B, 21A, 21B, 22A, 22B, 23A, 23B, 24A, and 24B are views illustrating a memory device and a method for fabricating the same according to another embodiment of the present disclosure.
Figure 18B:
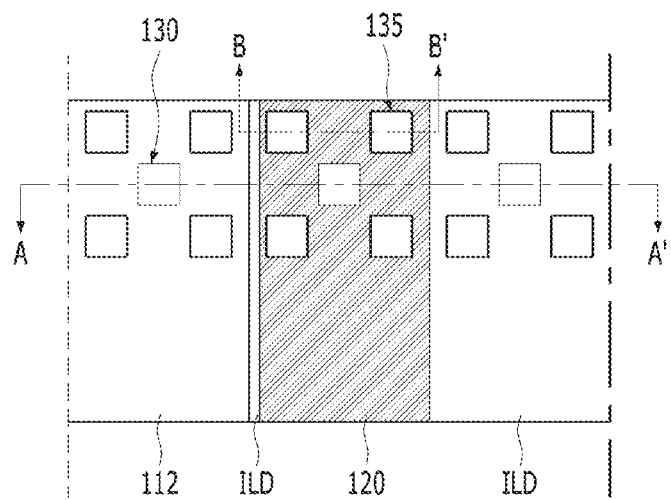

Referring to FIGS. 18A and 18B, substantially the same processes as shown in FIGS. 3A and 3B through FIGS. 4A and 4B are performed, and then contact holes 130 may be formed and at the same time, holes for forming support pillars, that is, support holes 135 may be formed.

When viewed from the top, the support holes 135 may be formed in a region which overlaps with a protrusion of each sacrificial layer 114 and/or each sacrificial pad 120 and in which the contact holes 130 are not formed. In an embodiment, four support holes 135 are arranged to be spaced apart at a predetermined distance from the contact hole 130 in the diagonal direction of the contact hole 130 and the planar size of the support hole 135 is substantially the same as that of the contact hole 130, but this embodiment is not limited thereto. The number, arrangement and planar size of the support holes 135 may be variously changed.

When viewed in cross-section, the support holes 135 may be formed to have the same depth as that of the contact holes 130. However, the depth of the support holes 135 may also be variously changed as long as the support holes 135 pass through the stack structure ST.

Figure 19A:
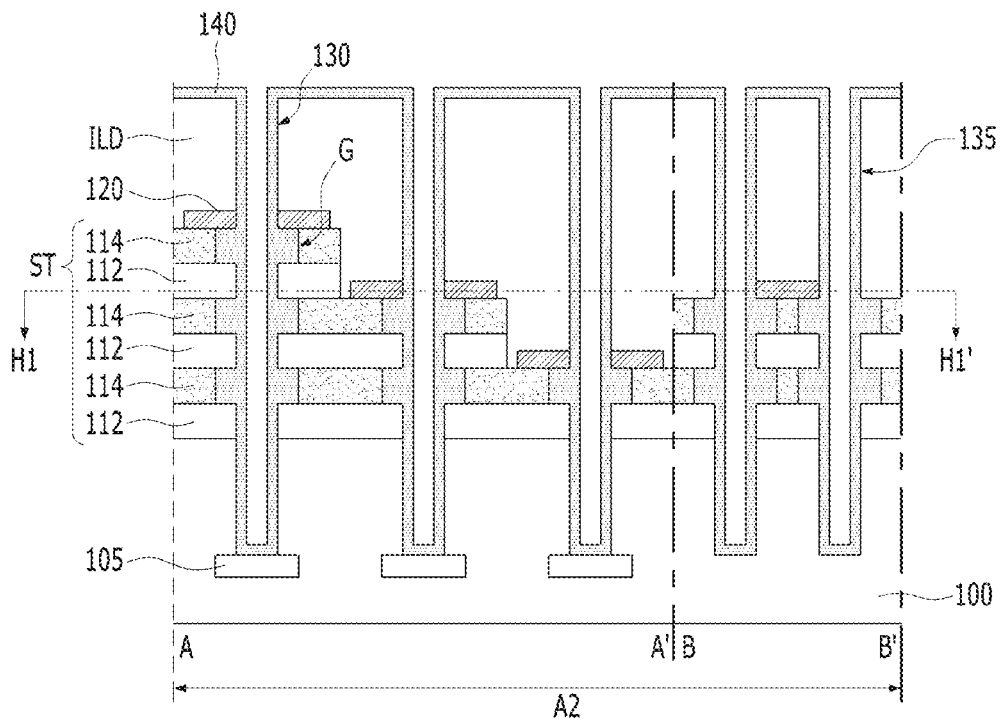
Figure 19B:
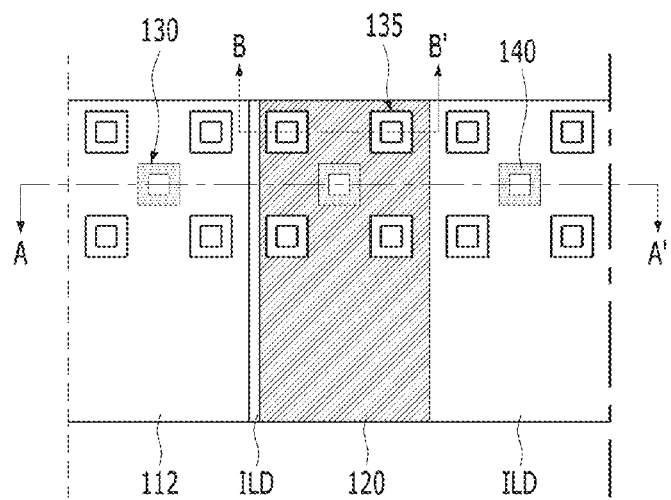

Referring to FIGS. 19A and 19B, the sacrificial layers 114 exposed through the contact holes 130 and the support holes 135 may be partially recessed to form grooves G which surround the sidewalls of the contact holes 130 and the support holes 135 while having a smaller width than that of the sacrificial pad 120.

Along the entire surface of the resulting structure having the grooves G formed therein, a sealing layer 140 may be formed to have a thickness that sufficiently fills the grooves G.

Figure 20A:
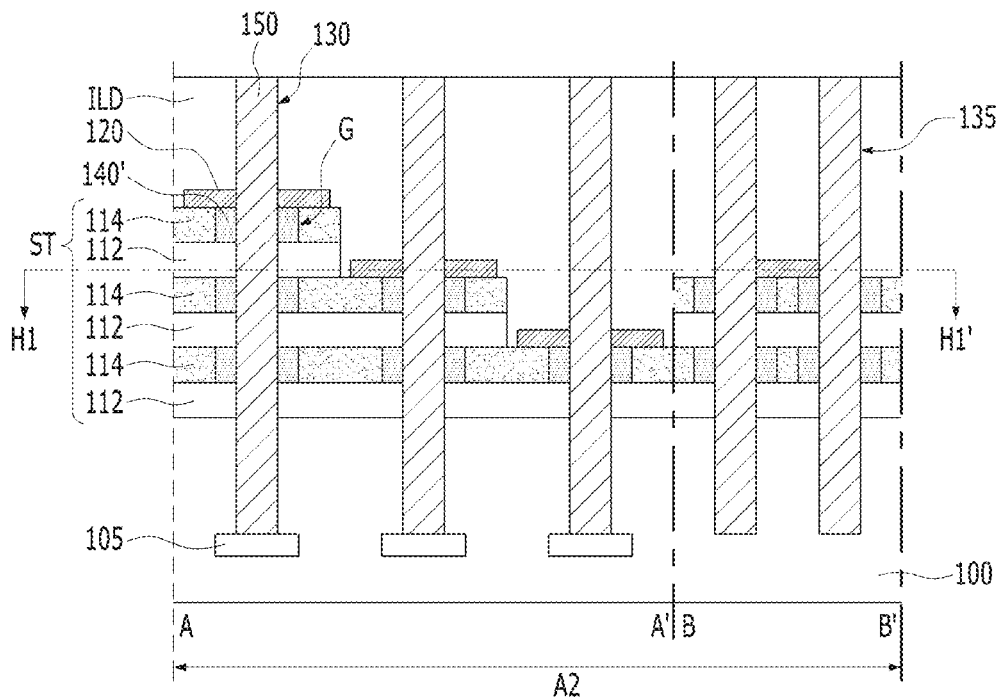
Figure 20B:
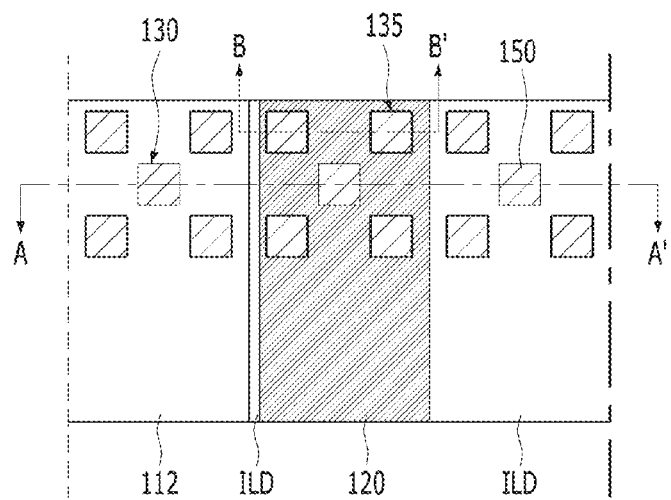

Referring to FIGS. 20A and 20B, the sealing layer 140 may be etched back to form sealing layer patterns 140' remaining only in the grooves G.

Then, the contact holes 130 and the support holes 135 may be filled with a conductive material to form contact plugs 150. However, in the support holes 135, support pillars should be formed, which should simply function to support the stack structure and do not perform an electrical function such as a current movement path. Thus, subsequent processes shown in FIGS. 21A and 21B through 22A and 22B may be further performed.

Figure 21A:
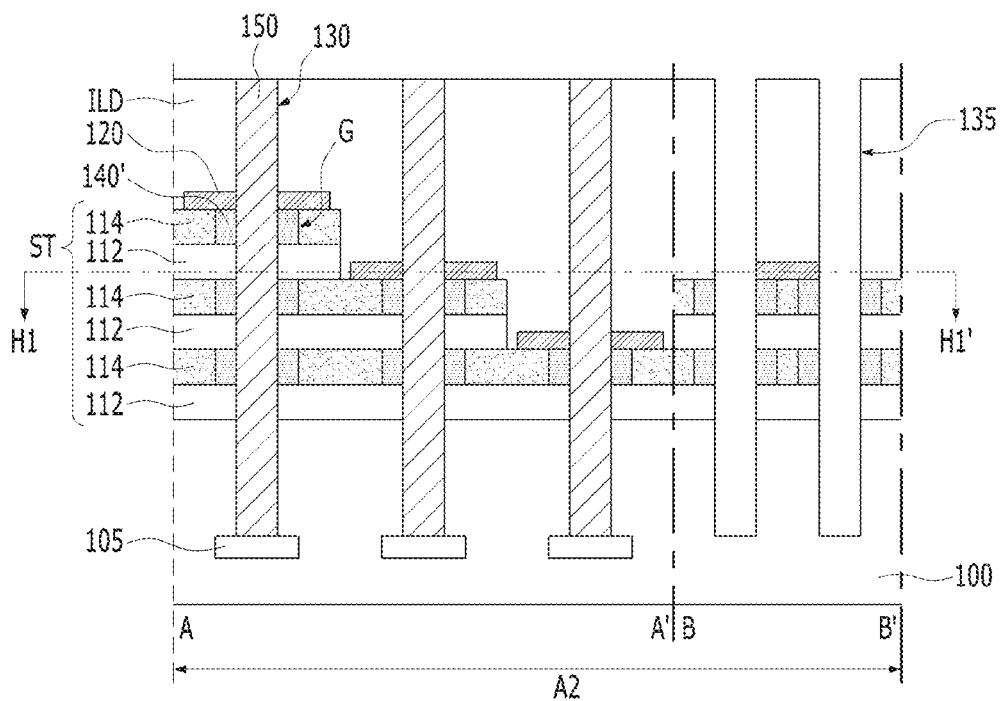
Figure 21B:
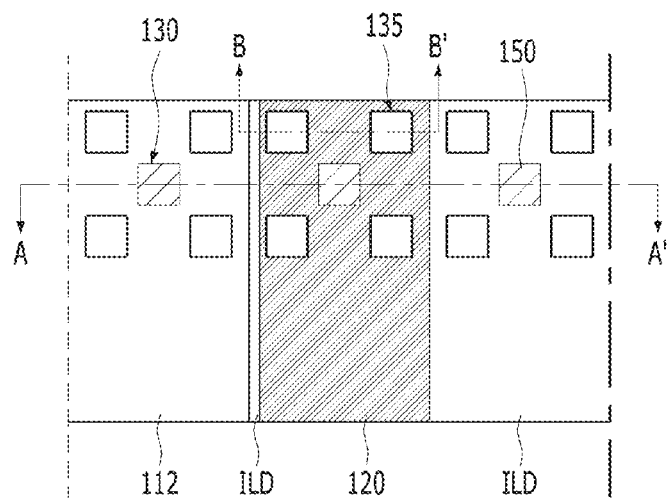

Referring to FIGS. 21A and 21B, the contact plug 150 in each support hole 135 may be selectively removed. This may be performed in a state in which a mask pattern (not shown) is formed, which may cover the contact holes 130 and expose the support holes 135.

Accordingly, an empty space may be formed again in each support hole 135.

Figure 22A:
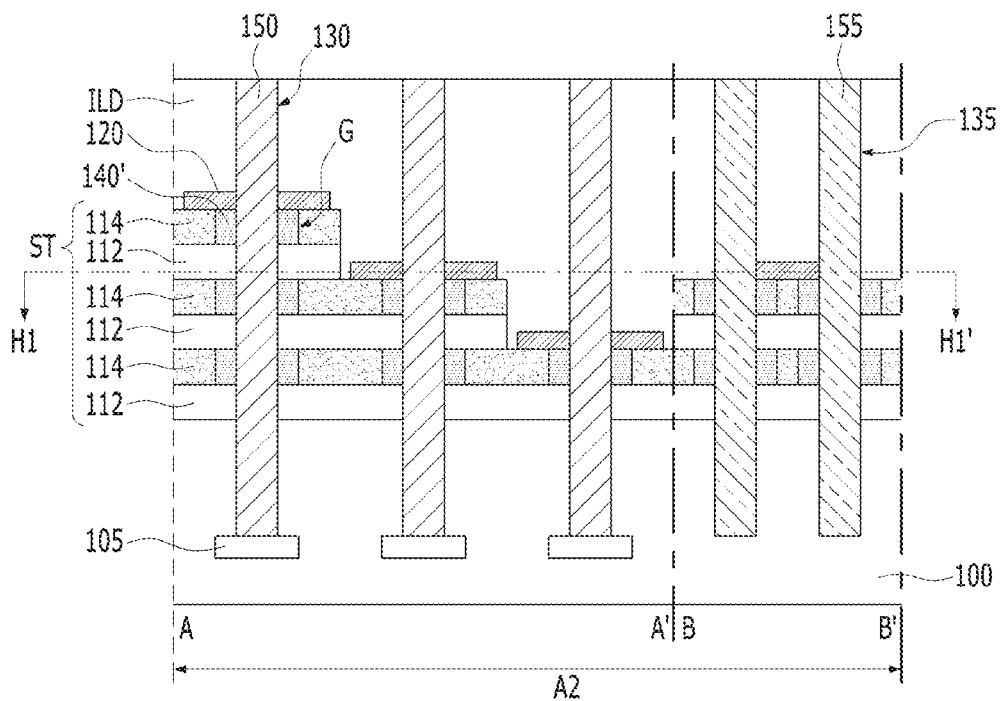
Figure 22B:
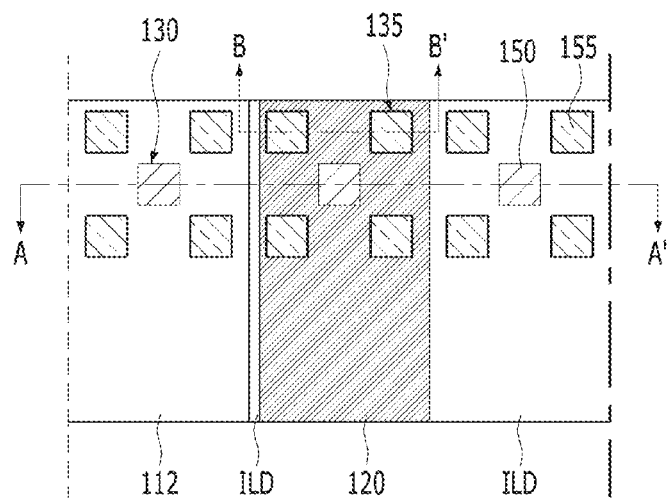

Referring to FIGS. 22A and 22B, each support hole 135 may be filled with a dielectric material to form support pillars 155. In an embodiment, the support pillars 155 may have substantially the same or the same bottom level as that of the contact plugs 150 as illustrated in FIG. 22A. For example, the bottom levels of the contact plugs 150 may be in contact with the peripheral circuit elements 105 and the bottom levels of the support pillars 155 may be located at substantially the same or the same as the bottom levels of the contact plugs 150. In some embodiments, the support holes 135 may have substantially the same depth as that of the contact holes 130.

The support pillars 155 may be formed by depositing a dielectric material to a thickness that sufficiently fills the support holes 135, and then performing a planarization process until the top surface of the interlayer dielectric layer ILD is exposed.

Since the support pillars 155 should not be lost during a subsequent process of removing the sacrificial layers 114 and the sacrificial pads 120, they may include a dielectric material (e.g., silicon oxide) having an etch rate different from those of the sacrificial layers 114 and the sacrificial pads 120.

Figure 23A:
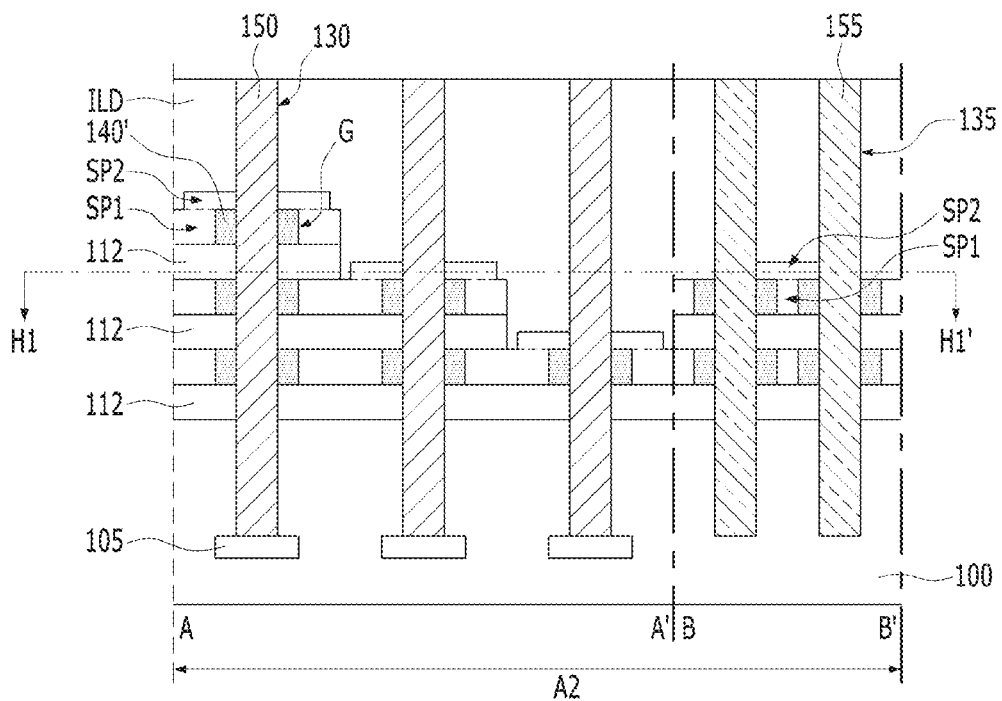
Figure 23B:
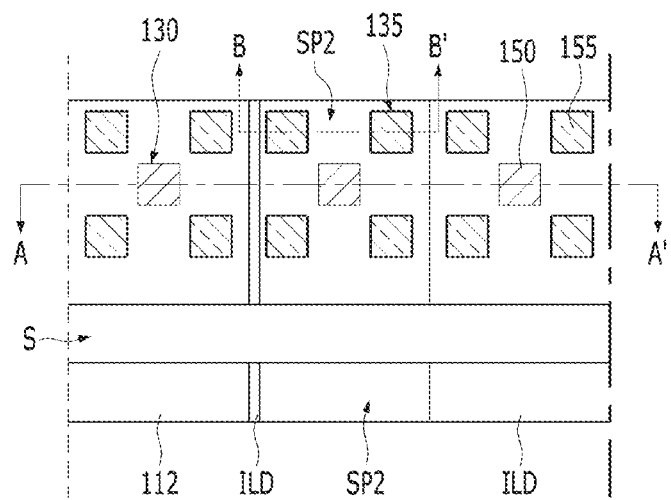

Referring to FIGS. 23A and 23B, the stack structure ST may be selectively etched to form a slit S, and then the sacrificial layers 114 and sacrificial pads 120 exposed through the slit S may be removed. The space formed by removal of the sacrificial layers 114 may be referred to as a first space SP1, and the space formed by removal of the sacrificial pads 120 may be referred to as a second space SP2.

Even though the first space SP1 and the second space SP2 are present in the stack structure due to removal of the sacrificial layers 114 and the sacrificial pads 120, not only the contact plugs 150 but also the support pillars 155 contact the inter-gate dielectric layers 112 and function to support them, and thus a leaning phenomenon in which the stack structure collapses may be further prevented.

Figure 24A:
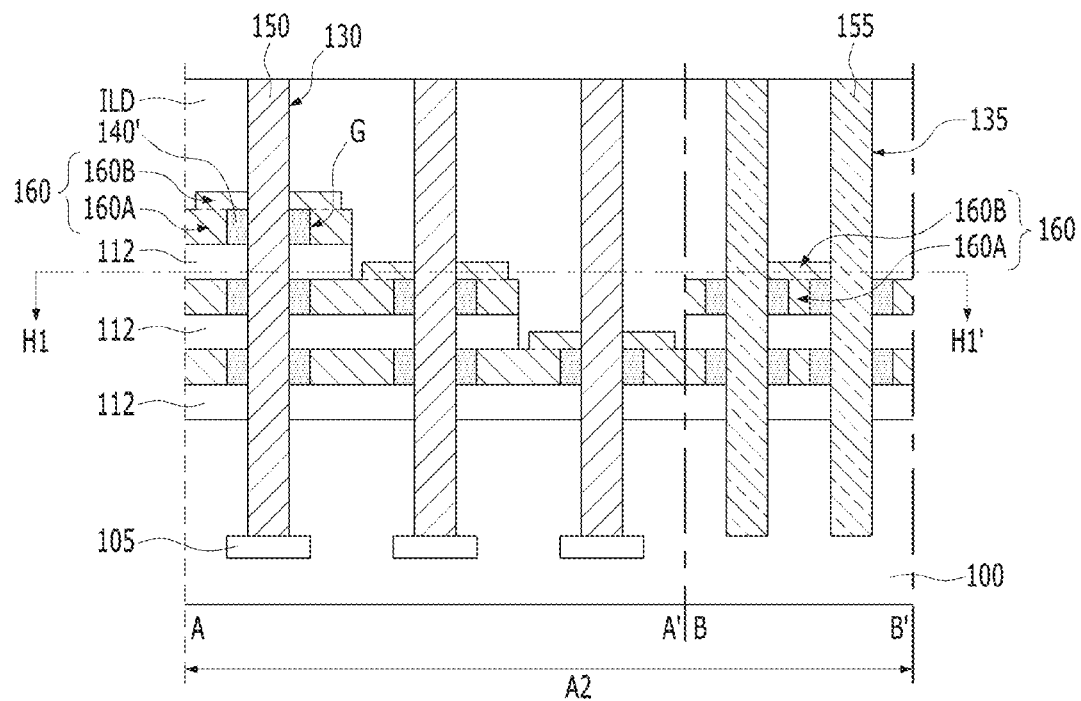
Figure 24B:
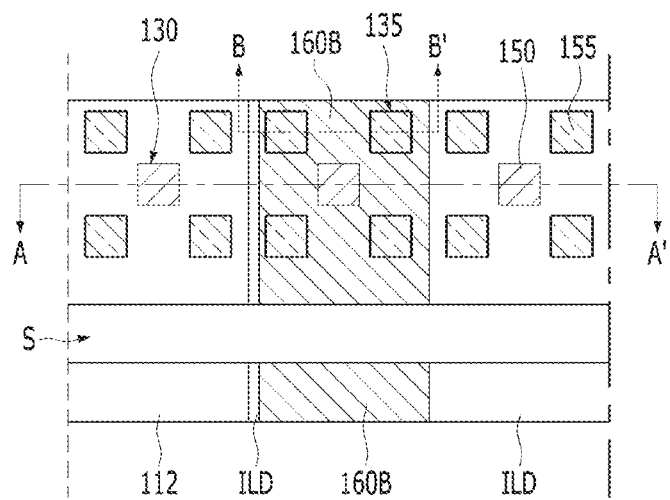

Referring to FIGS. 24A and 24B, the first space SP1 and the second space SP2 may be filled with a conductive material, thereby forming a conductive pattern 160 including a first conductive pattern 160A, which functions as the gate electrode layer of the memory cell, and a second conductive pattern 160B functioning as a connection portion that connects the gate electrode layer to the contact plug 150.

As a result, a memory device including the structure of the contact region A2 shown in FIGS. 24A and 24B may be fabricated.

Referring to FIGS. 24A and 24B again, the memory device of this embodiment may further include the support pillars 155 which perform a support function around the contact plugs 150 together with the contact plugs 150. Accordingly, in addition to the same effects as those obtained in the embodiment of FIGS. 3A and 3B through FIGS. 11A and 11B, the effect of further preventing the stack structure from leaning may be obtained.

The embodiments shown in FIGS. 18A and 18B through 24A and 24B describe the case in which the support pillars 155 are further formed based on the embodiment of FIGS. 3A and 3B through FIGS. 11A and 11B, but these embodiments may also be sufficiently applied to the case in which the support pillars 155 are further formed based on the embodiments of FIGS. 12A and 12B through 17A and 17B.

While the embodiments described above have been described with respect to the contact region having the stepped structure in the three-dimensional memory device, the embodiments of the present disclosure are not limited thereto. If any semiconductor device has a stepped structure and formation of a contact plug to be connected to each step is required, the above-described embodiments are applicable.

As described above, the semiconductor device, the method for fabricating the same, and the memory device including the same, according to the embodiments of the present disclosure, make it possible to improve processes and enable the area to be reduced.

Figure 25:
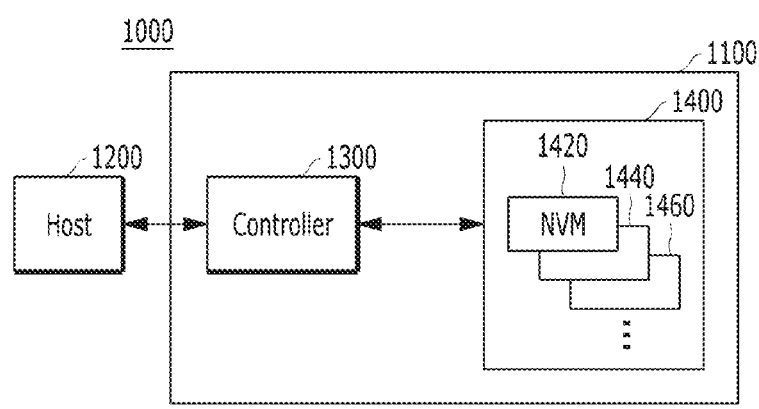
FIG. 25 shows an example of an apparatus or system capable of implementing the memory circuit or semiconductor device of the above-described embodiments.

The memory circuit or semiconductor device of the above embodiments may be used in various devices or systems. FIG. 25 shows an example of an apparatus or system capable of implementing the memory circuit or semiconductor device of the above-described embodiments.

FIG. 25 is an example of a configuration diagram of a data processing system for implementing a memory device according to an embodiment of the present disclosure.

Referring to FIG. 25, the data processing system 1000 may include a host 1200 and a memory system 1100.

The host 1200 may include wire or wireless electronic devices. For example, the host 1200 may include portable electronic devices such as mobile phones, an MP3 player, a laptop computer, or the like, or electronic devices such as a desktop computer, a game machine, TV, a projector, or the like.

In addition, the host 1200 may include at least one operating system (OS). The operating system may generally manage and control functions and operations of the host 1200 and provide interoperability between the host 1200 and a user using the data processing system 1000 or the memory system 1100. Here, the operating system may support functions and operations corresponding to purpose of use of the user, and may be classified into a general operating system and a mobile operating system according to mobility of the host 1200, for example. The general operating system may be classified into a personal operating system and an enterprise operating system according to a user's usage environment. The personal operating system may be a system that is characterized to support a service providing function for a general user, and may include, for example, windows, chrome, and the like. The enterprise operating system may be a system that is characterized to secure and support high performance, and may include, for example, a windows server, Linux, Unix, and the like. The mobile operating system may be a system that is characterized to support a mobility service provisioning function and a power saving function to users, and may include, for example, android, iOS, windows mobile, and the like. The host 1200 may include a plurality of operating systems and may execute these operating systems for performing operations with the memory system 1100 corresponding to a user's request.

The memory system 1100 may operate in response to a request from the host 1200, and specifically, may store data accessed by the host 1200. In other words, the memory system 1100 may be used as a main memory or an auxiliary memory of the host 1200. Here, the memory system 1100 may be implemented as any one of various types of storage devices according to a host interface protocol connected to the host 1200. For example, the memory system 1100 may be implemented as any one of a solid state drive (SSD), a multimedia card (MMC) such as a MMC, an embedded MMC (eMMC), a reduced size MMC (RS-MMC) or a micro-MMC, a secure digital (SD) card such as an SD, a mini-SD or a micro-SD, a universal storage bus (USB) storage device, a universal flash storage (UFS) device, a compact flash (CF) card, a smart media card, a memory stick, and the like.

The memory system 1100 may include a memory device 1400 that is a portion of storing data accessed by the host 1200 and a controller 1300 that controls data storage in the memory device 1400.

Here, the controller 1300 and the memory device 1400 may be integrated into one semiconductor device. For example, the controller 1300 and the memory device 1400 may be integrated into one semiconductor device to configure an SSD. When the memory system 1100 is used as an SSD, an operating speed of the host 1200 connected to the memory system 1100 may be further improved. Alternatively, for example, the controller 1300 and the memory device 1400 may be integrated into one semiconductor device to configure a memory card such as a personal computer (PC) card, a compact flash (CF) card, a smart media (SM) card, a memory stick, a multimedia card such as an MMC, an RS-MMC or a micro-MMC, an SD card such as an SD, a mini-SD, a micro-SD or a secure digital high capacity (SDHC), a universal flash storage (UFS), or the like. Alternatively, for example, the memory system 1100 may configure a computer, a ultra mobile PC (UMPC), a workstation, a netbook, a personal digital assistants (PDA), a portable computer, a web tablet, a table computer, a wireless phone, a mobile phone, a smart phone, an e-book, a portable multimedia player (PMP), a portable game machine, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage constituting a data center, a device capable of transmitting and receiving information in a wireless environment, one of various electronic devices constituting a home network, one of various electronic devices constituting a computer network, one of various electronic devices constituting a telematics network, a radio frequency identification device (RFID), or one of various components constituting a computing system.

The memory device 1400 in the memory system 1100 may maintain the stored data even when no power is supplied, and for example, may store data provided from the host 1200 via a write operation and provide the stored data to the host 1200 via a read operation. Here, the memory device 1400 may include a plurality of memories 1420, 1440 and 1460. Each of the plurality of memories 1420, 1440 and 1460 may include the three-dimensional non-volatile memory device of the above-described embodiments. For example, each of the plurality of memories 1420, 1440 and 1460 may include: a stack structure including a plurality of first conductive patterns and a plurality of dielectric layers, which are alternately stacked, the stack structure having a stepped structure such that any one of the first conductive patterns further protrudes than the first conductive pattern positioned immediately above it; a plurality of second conductive patterns which are respectively formed over protrusions of the first conductive patterns; a plurality of contact plugs which overlap the plurality of second conductive patterns, respectively, and pass through the overlapping second conductive patterns and the stack structure; and a sealing layer which is interposed between the first conductive patterns and the contact plugs and separates the first conductive patterns from the contact plugs. Thereby, a fabrication process of the memory device 1400 may be improved and an area of the memory device 1400 may be reduced. As a result, a fabrication process of the memory system 1100 may be improved and an area of the memory system 1100 may be reduced.

The controller 1300 in the memory system 1100 may control the memory device 1400 in response to a request from the host 1200. For example, the controller 1300 may provide the data read from the memory device 1400 to the host 1200 and store the data provided from the host 1200 in the memory device 1400. To this end, the controller 1300 may control operations such as read, write, program, erase, etc.

For the above operations, the controller 1300 may include an interface unit for communication with the host 1200, an interface unit for communication with the memory device 1400, an operating memory for storing data for operations of the controller 1300 and/or the memory system 1100, a processor for controlling overall operations of the controller 1300 and/or the memory system 1100, and for this purpose, including a firmware such as a flash translation layer (FTL) and implemented as a microprocessor or a central processing unit (CPU), or the like.

However, a system in which the memory circuit or the semiconductor device of the above-described embodiments can be used is not limited to the system of FIG. 25. The memory circuit or the semiconductor device of the above-described embodiments may be provided in various systems requiring a non-volatile memory.

While various embodiments have been described above, it will be understood to those skilled in the art that the embodiments described are by way of example only. Accordingly, the disclosure described herein should not be limited based on the described embodiments.

What is claimed is:

1. A method for fabricating a semiconductor device, comprising:
   forming a stack structure comprising a plurality of sacrificial layers and a plurality of dielectric layers, which are alternately stacked, the stack structure having a stepped structure such that any one of the sacrificial layers further protrudes than the sacrificial layer positioned immediately above it;
   forming a plurality of sacrificial pads over protrusions of the plurality of sacrificial layers, respectively;
   forming a plurality of contact holes which overlap the plurality of sacrificial pads, respectively, and pass through the overlapping sacrificial pads and the stack structure;
   forming grooves by recessing a portion of the sacrificial layers exposed through the contact holes;
   forming a sealing layer which fills the grooves;
   forming contact plugs which fill the contact holes;
   forming a slit which passes through the stack structure;
   removing the sacrificial layers and sacrificial pads exposed through the slit; and
   filling, with a conductive material, spaces from which the sacrificial layers and the sacrificial pads have been removed.

2. The method of claim 1, wherein the contact plugs are in direct contact with the conductive material filling the spaces, from which the sacrificial pads have been removed, without being in direct contact with the conductive material filling the spaces from which the sacrificial layers have been removed.

3. The method of claim 1, wherein the forming of the grooves is performed such that a distance from a side surface of the contact hole to a side surface of the groove is smaller than a distance from the side surface of the contact hole to a side surface of the sacrificial pad.

4. The method of claim 1, wherein the sacrificial layers, the sacrificial pads and the sealing layer have different etch rates.

5. The method of claim 1, wherein the sacrificial layers, the sacrificial pads, and the dielectric layers have different etch rates.

6. The method of claim 1, further comprising a peripheral circuit element disposed below the stack structure, wherein the forming of the contact holes is performed to a depth that exposes the peripheral circuit element.

7. The method of claim 1, wherein each of the sacrificial pads is formed to be spaced apart from a dielectric layer having a bottom surface that is positioned at substantially the same level as a sacrificial pad, from the sacrificial pads, is located at.

8. The method of claim 1, wherein each of the sacrificial pads has a smaller thickness than a dielectric layer having a bottom surface positioned at substantially the same level as a sacrificial pad, from the sacrificial pads, is located at.

9. The method of claim 1, wherein the forming of the contact holes further comprises forming support holes which overlap the plurality of sacrificial pads, respectively, pass through the overlapping sacrificial pads and the stack structure, and are spaced apart from the contact holes, and the method further comprises, before the removing of the sacrificial layers and the sacrificial pads, forming support pillars which fill the support holes.

10. The method of claim 9, wherein the forming of the support pillars comprises:
    filling the support holes together with the contact holes with the contact plugs during the forming of the contact plugs;
    selectively removing the contact plugs in the support holes; and
    filling the support holes with a dielectric material.

11. The method of claim 9, wherein the support holes have substantially the same depth as that of the contact holes.

12. A method for fabricating a semiconductor device, comprising:
    forming a stack structure comprising a plurality of sacrificial layers and a plurality of dielectric layers, which are alternately stacked, the stack structure having a stepped structure such that any one of the sacrificial layers further protrudes than the sacrificial layer positioned immediately above it;
    forming a plurality of sacrificial pads over protrusions of the plurality of sacrificial layers, respectively;
    forming a plurality of sacrificial pads on protrusions of the plurality of sacrificial layers, respectively;
    forming a plurality of contact holes which overlap the plurality of sacrificial pads, respectively, and pass through the overlapping sacrificial pads and the stack structure;
    forming a sealing layer on a side wall of the contact holes;
    forming contact plugs which fill the contact holes having the sealing layer formed thereon;
    forming a slit which passes through the stack structure;
    removing the sacrificial pads exposed through the slit, and removing the sealing layer exposed by removal of the sacrificial pads;
    removing the sacrificial layers exposed through the slit; and filling, with a conductive material, spaces from which the sacrificial layers and the sacrificial pads have been removed.

\* \* \* \* \*